(12) United States Patent
Zhang et al.

(10) Patent No.: US 11,742,878 B2
(45) Date of Patent: Aug. 29, 2023

(54) OCCUPANCY INFORMATION PREDICTION METHOD, ENCODER, DECODER, AND STORAGE MEDIUM

(71) Applicant: GUANGDONG OPPO MOBILE TELECOMMUNICATIONS CORP., LTD., Guangdong (CN)

(72) Inventors: Wei Zhang, Guangdong (CN); Fuzheng Yang, Guangdong (CN); Shuai Wan, Guangdong (CN); Yanzhuo Ma, Guangdong (CN); Junyan Huo, Guangdong (CN); Zhecheng Wang, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 0 days.

(21) Appl. No.: 17/655,345

(22) Filed: Mar. 17, 2022

(65) Prior Publication Data
US 2022/0247427 A1 Aug. 4, 2022

Related U.S. Application Data

(63) Continuation of application No. PCT/CN2019/109661, filed on Sep. 30, 2019.

(51) Int. Cl.
*H03M 1/00* (2006.01)
*H03M 7/30* (2006.01)

(52) U.S. Cl.
CPC ....... *H03M 7/6011* (2013.01); *H03M 7/6005* (2013.01)

(58) Field of Classification Search
CPC ............ H03M 7/6011; H03M 7/6005; H03M 7/3079; H03M 7/3075; G06T 9/001;
(Continued)

(56) References Cited

U.S. PATENT DOCUMENTS 11,206,426 B2 * 12/2021 Sugio ...................... H04N 19/46
2014/0376827 A1 * 12/2014 Jiang ...................... G06T 17/205
382/238
(Continued)

FOREIGN PATENT DOCUMENTS

CN 107403456 A 11/2017
CN 108335335 A 7/2018
(Continued)

OTHER PUBLICATIONS

3DG, Approved WG 11 Document; ISO/IEC JTC 1/SC 29/WG 11 N18673; Sep. 6, 2019. 62 pages.
(Continued)

*Primary Examiner* — Jean B Jeanglaude
(74) *Attorney, Agent, or Firm* — Perkins Coie LLP

(57) ABSTRACT

Embodiments of the present application provide an occupancy information prediction method, an encoder, a decoder, and a storage medium. The occupancy information prediction method comprises: when an encoder encodes geometrical information on the basis of an octree, determining encoding information corresponding to a neighboring node of a node to be predicted, and a distance parameter between a child node of the node to be predicted and the neighboring nodes; wherein the encoding information corresponding to the neighboring node comprises occupancy information; determining an occupancy weight corresponding to the child node of the node to be predicted according to the distance parameter, and the encoding information corresponding to the neighboring node; performing a prediction processing on the child node according to the occupancy weight and a preset occupancy threshold set to obtain a node type corresponding to the child node.

18 Claims, 8 Drawing Sheets

(58) Field of Classification Search
CPC ......... G06T 9/004; G06T 9/40; H04N 19/597; H04N 19/96
USPC .......................................................... 341/899
See application file for complete search history.

(56) References Cited

U.S. PATENT DOCUMENTS

| | | | |
|---|---|---|---|
| 2017/0347100 | A1 | 11/2017 | Chou et al. |
| 2019/0156520 | A1 | 5/2019 | Mammou et al. |
| 2020/0252659 | A1* | 8/2020 | Lasang ............... H04N 19/46 |
| 2022/0417557 | A1* | 12/2022 | Oh ........................ G06T 9/001 |

FOREIGN PATENT DOCUMENTS

| | | |
|---|---|---|
| CN | 108632621 A | 10/2018 |
| CN | 109257604 A | 1/2019 |
| CN | 110097605 A | 8/2019 |
| EP | 3595180 A1 | 1/2020 |

OTHER PUBLICATIONS

Extended European Search Report for European Application No. 19947488.3 dated Oct. 6, 2022. 12 pages.
ISO/IEC "Information technology—MPEG-I (Coded Representation of Immersive Media)—Part 9: Geometry-based Point Cloud Compression" ISO/IEC 23090-9; 2019. 118 pages.
International Search Report dated Jul. 3, 2020 of PCT/CN2019/109661 (6 pages).
ISO/IEC 23090-9:2018(E)—ISO/IEC JTC 1/SC 29/WG 11—Secretariat: JISC—Information technology—MPEG-I (Coded Representation of Immersive Media)—Part 9: Geometry-based Point Cloud Compression (88 pages).
Mammou, Khaled et al. "G-PCC codec description v2" International Organisation for Standardisation Organisation Internationale De Normalisation ISO/IEC JTC1/SC29/WG11 Coding of Moving Pictures and Audio N18189—Jan. 31, 2019 (39 pages).
Lasserre, L., et al., International Organisation for Standardisation Organisation Internationale De Normalisation ISO/IEC JTC1/SC29/WG11 Coding of Moving Pictures and Audio ISO/IEC JTC1/SC29/WG11 MPEG2018/m43600Jul. 2018, Ljubljana, Slovenia—BlackBerry, Input contribution, [PCC] Intra mode for geometry coding in TMC3 (3 pages).

* cited by examiner

OCCUPANCY INFORMATION PREDICTION METHOD, ENCODER, DECODER, AND STORAGE MEDIUM

CROSS-REFERENCE TO RELATED APPLICATION

The present application is a continuation application of International PCT Application No. PCT/CN2019/109661, filed on Sep. 30, 2019, the entire content of which is hereby incorporated by reference.

TECHNICAL FIELD

Embodiments of the present application relate to encoding and decoding technologies in the communication field, in particular to a method for predicting occupancy information, an encoder, a decoder, and a storage medium.

BACKGROUND

In an encoder framework of Geometry-based Point Cloud Compression (G-PCC), after an input point cloud is partitioned into slices, each slice will be encoded independently, while in each slice, geometric information of a point cloud and attribute information corresponding to each point cloud are encoded separately.

At present, there are mainly two encoding modes for geometric information: octree-based geometric information encoding and triangle soup (trisoup)-based geometric information encoding. In a process of octree-based geometric information encoding, spatial correlation between a node to be predicted and neighboring nodes around it may be used for intra prediction on occupancy information of child nodes of the node to be predicted. Specifically, there are 26 neighboring nodes around the node to be predicted, and whether child nodes of the node to be predicted are occupied may be predicted according to occupancy information of the 26 neighboring nodes of the node to be predicted, that is, intra prediction.

In the above-mentioned intra prediction technical solution of octree-based geometric information encoding, although the occupancy information of the 26 neighboring nodes around the node to be predicted is used for achieving intra prediction on the occupancy information of the child nodes of the node to be predicted, occupancy information of one neighboring node cannot fully reflect occupancy information of 8 child nodes of the neighboring node, so spatial correlation of neighboring nodes is not fully utilized during the intra prediction, thereby affecting accuracy of intra prediction and further reducing encoding efficiency.

SUMMARY

Embodiments of the present application provide a method for predicting occupancy information, an encoder, a decoder, and a storage medium, which can fully utilize spatial correlation of neighboring nodes, thereby improving accuracy of intra prediction and further improving encoding efficiency.

Technical solutions of the embodiments of the present application may be implemented as follows.

In a first aspect, an embodiment of the present application provides a method for predicting occupancy information, applied to an encoder, the method includes: determining occupancy information corresponding to a neighboring node of a node to be predicted, an encoding state of the neighboring node, a quantity of occupied child nodes of an encoded neighboring node in neighboring nodes, and a distance parameter between a child node of the node to be predicted and the neighboring node when encoding geometric information based on an octree; acquiring a preset weight set according to the distance parameter and the quantity of the occupied child nodes; determining an occupancy weight corresponding to the child node based on the preset weight set, the encoding state, and the occupancy information; performing a prediction processing on the child node according to the occupancy weight and a preset occupancy threshold set to obtain a node type corresponding to the child node; and outputting predicted occupancy information of the node to be predicted based on the node type.

In a second aspect, an embodiment of the present application provides a method for predicting occupancy information, applied to a decoder, the method includes: determining occupancy information corresponding to a neighboring node of a node to be predicted, a decoding state of the neighboring node, a quantity of occupied child nodes of a decoded neighboring node in neighboring nodes, and a distance parameter between a child node of the node to be predicted and the neighboring node when decoding geometric information based on an octree; acquiring a preset weight set according to the distance parameter and the quantity of the occupied child nodes; determining an occupancy weight corresponding to the child node based on the preset weight set, the decoding state, and the occupancy information; performing a prediction processing on the child node according to the occupancy weight and a preset occupancy threshold set to obtain a node type corresponding to the child node; and outputting predicted occupancy information of the node to be predicted based on the node type.

In a third aspect, an embodiment of the present application provides an encoder, including: a first determining part, a first acquiring part, and a first output part, wherein the first determining part is configured to determine occupancy information corresponding to a neighboring node of a node to be predicted, an encoding state of the neighboring node, a quantity of occupied child nodes of an encoded neighboring node in neighboring nodes, and a distance parameter between the child node of the node to be predicted and the neighboring node when encoding geometric information based on an octree; the first acquiring part is configured to acquire a preset weight set according to the distance parameter and the quantity of the occupied child nodes; the first determining part is further configured to determine an occupancy weight corresponding to the child node based on the preset weight set, the encoding state, and the occupancy information; the first acquiring part is further configured to perform a prediction processing on the child node according to the occupancy weight and a preset occupancy threshold set to obtain a node type corresponding to the child node; and the first output part is configured to output predicted occupancy information of the node to be predicted based on the node type.

In a fourth aspect, an embodiment of the present application provides a decoder, including: a second determining part, a second acquiring part, and a second output part, wherein the second determining part is configured to determine occupancy information corresponding to a neighboring node of a node to be predicted, a decoding state of the neighboring node, a quantity of occupied child nodes of a decoded neighboring node in neighboring nodes, and a distance parameter between a child node of the node to be predicted and the neighboring node when decoding geometric information based on an octree; the second acquiring part is configured to acquire a preset weight set according to the distance parameter and the quantity of the occupied child nodes; the second determining part is further configured to determine an occupancy weight corresponding to the child node based on the preset weight set, the decoding state, and the occupancy information; the second acquiring part is further configured to perform a prediction processing on the child node according to the occupancy weight and a preset occupancy threshold set to obtain a node type corresponding to the child node; and the second output part is configured to output predicted occupancy information of the node to be predicted based on the node type.

In a fifth aspect, an embodiment of the present application further provides an encoder, including a first processor, a first memory storing instructions executable by the first processor thereon, a first communication interface, and a first bus configured to connect the first processor, the first memory, and the first communication interface, wherein when the instructions are executed by the first processor, the method for predicting the occupancy information as described above is implemented.

In a sixth aspect, an embodiment of the present application further provides a decoder, including a second processor, a second memory storing instructions executable by the second processor thereon, a second communication interface, and a second bus configured to connect the second processor, the second memory, and the second communication interface, wherein when the instructions are executed by the second processor, the method for predicting the occupancy information as described above is implemented.

In a seventh aspect, an embodiment of the present application further provides a computer-readable storage medium having a program applied to an encoder stored thereon, wherein when the program is executed by a processor, the method for predicting the occupancy information as described above is implemented.

In an eighth aspect, an embodiment of the present application further provides a computer-readable storage medium having a program applied to a decoder stored thereon, wherein when the program is executed by a processor, the method for predicting the occupancy information as described above is implemented.

The embodiments of the present application provide a method for predicting occupancy information, an encoder, a decoder, and a storage medium. When encoding geometric information based on an octree, the encoder determines occupancy information corresponding to a neighboring node of a node to be predicted, an encoding state of the neighboring node, a quantity of occupied child nodes of an encoded neighboring node in neighboring nodes, and a distance parameter between a child node of the node to be predicted and the neighboring node; acquires a preset weight set according to the distance parameter and the quantity of the occupied child nodes; determines an occupancy weight corresponding to the child node based on the preset weight set, the encoding state, and the occupancy information; performs a prediction processing on the child node according to the occupancy weight and a preset occupancy threshold set to obtain a node type corresponding to the child node; and outputs predicted occupancy information of the node to be predicted based on node types. When decoding geometric information based on an octree, the decoder determines occupancy information corresponding to a neighboring node of a node to be predicted, a decoding state of the neighboring node, a quantity of occupied child nodes of a decoded neighboring node in neighboring nodes, and a distance parameter between a child node of the node to be predicted and the neighboring node; acquires a preset weight set according to the distance parameter and the quantity of the occupied child nodes; determines an occupancy weight corresponding to the child node based on the preset weight set, the decoding state, and the occupancy information; performs a prediction processing on the child node according to the occupancy weight and a preset occupancy threshold set to obtain a node type corresponding to the child node; and outputs predicted occupancy information of the node to be predicted based on node types. It may be seen that in the embodiment of the present application, when using occupancy information of a neighboring node for intra prediction of occupancy information on a node to be predicted, a codec may introduce an encoding and decoding state of the neighboring node into a prediction process. Specifically, if the encoding and decoding state of the neighboring node indicates encoded or decoded, an occupancy situation of a child node corresponding to the neighboring node may be added into a process of weight calculation and threshold comparison, so that spatial correlation of neighboring nodes is fully utilized, thereby improving accuracy of intra prediction and further improving encoding efficiency.

DETAILED DESCRIPTION

In order to understand features and technical contents of embodiments of the present application in more detail, implementations of the embodiments of the present application will be described in detail below in combination with the accompanying drawings, which are for reference only and are not intended to limit the embodiments of the present application.

In an embodiment of the present application, in an encoder framework of G-PCC for a point cloud, after a point cloud of an input three-dimensional (3D) picture model is partitioned into slices, each slice is independently encoded.

Figure 1:
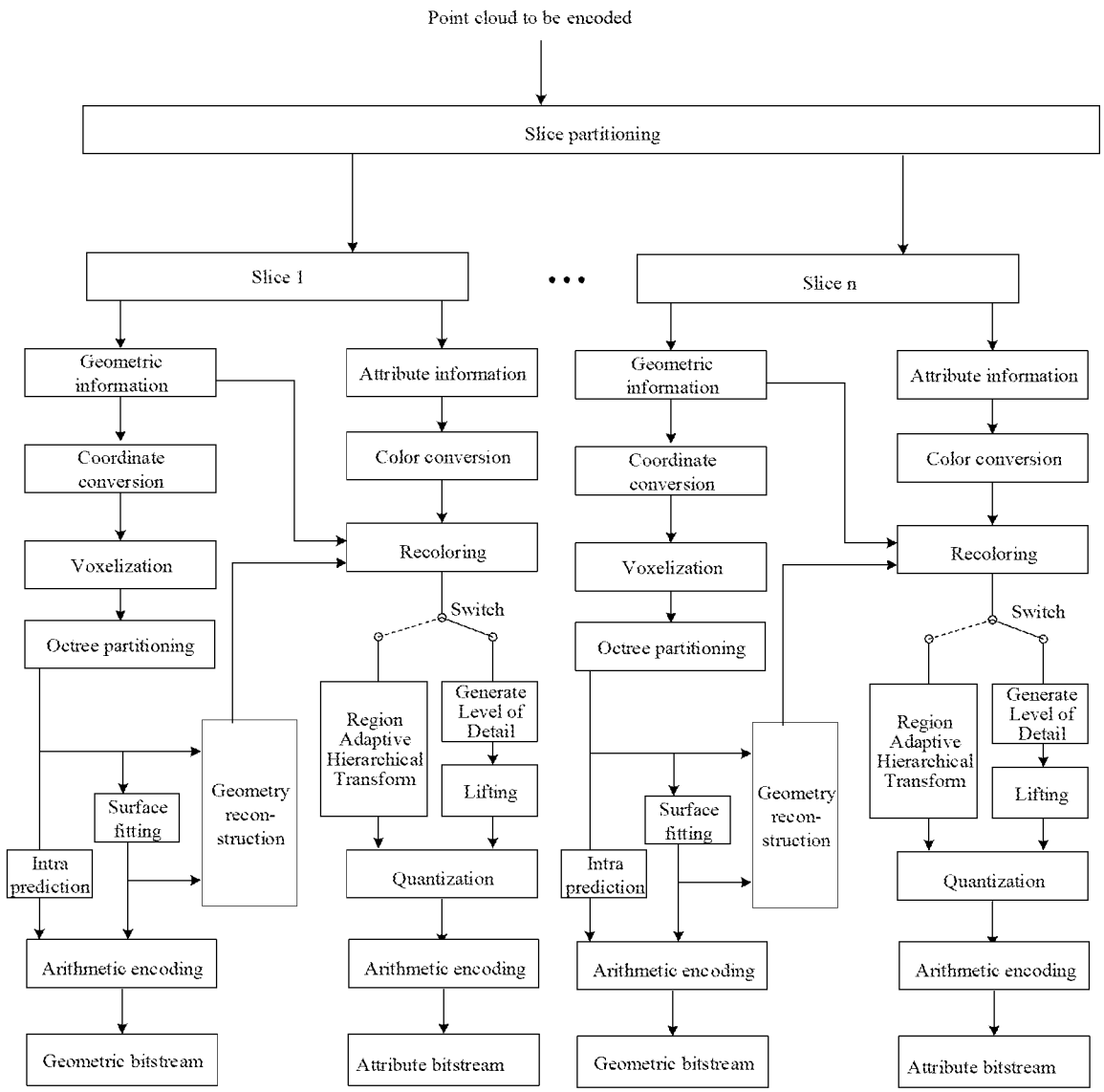
FIG. 1 is a flowchart of G-PCC encoding.

FIG. 1 is a flowchart of G-PCC encoding. As shown in FIG. 1, the flowchart of G-PCC encoding is applied in a point cloud encoder, for point cloud data to be encoded, the point cloud data is partitioned into multiple slices through slice partitioning. In each slice, geometric information of the point cloud and attribute information corresponding to each point cloud are encoded separately. Herein an approach of geometric information encoding mainly include octree-based geometric information encoding and trisoup-based geometric information encoding, the attribute information encoding mainly includes distance-based lifting transform which depends on Level of Detail (LOD) partitioning and Region Adaptive Hierarchical Transform (RAHT) directly performed.

In a process of geometric encoding, coordinate conversion is performed on geometric information, so that all point clouds are contained in a bounding box, and then quantization is performed. The quantization in this act mainly plays a role of scaling. Because of quantization rounding, geometric information of a part of point clouds is the same, then whether to remove duplicate points is determined based on a parameter, a process of quantization and removal of duplicate points is also called a voxelization process. Then, the bounding box is subjected to octree partitioning. Geometric information encoding may be partitioned into two kinds of frameworks according to different layer level depths of octree partitioning: an octree-based geometric information encoding framework and a trisoup-based geometric information encoding framework.

Figure 3:
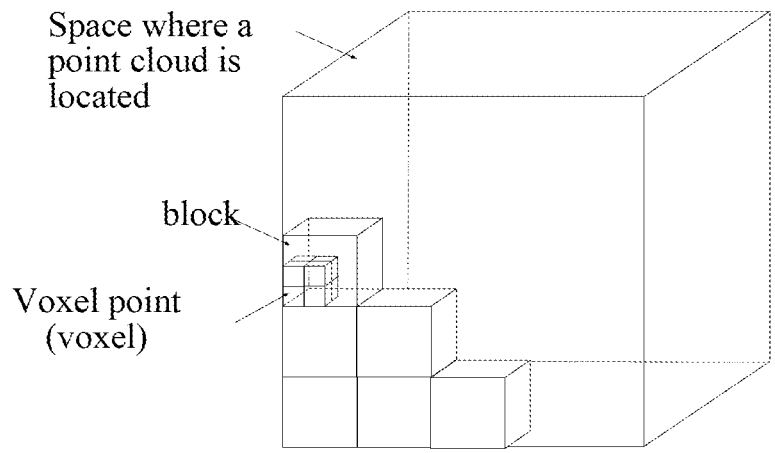
FIG. 3 is a schematic diagram of octree partitioning.

Specifically, FIG. 3 is a schematic diagram of octree partitioning. As shown in FIG. 3, an implementation process of block partitioning performed by a codec in a space where a point cloud to be encoded and decoded is located to obtain n blocks is as follows: the codec partitions the point cloud into several N×N×N blocks with a same size by means of an octree, wherein N may be set as a fixed value or set separately according to different point clouds, which is not limited in the embodiment of the present application. That is, each block contains N×N×N voxel points, or called voxels. A unit of voxel is 1, which represents a point to be encoded and decoded in the point cloud to be encoded.

In a process of octree-based geometric information encoding, the bounding box is equally partitioned into 8 sub-cubes, and a non-empty sub-cube (containing points in the point cloud) may be continued to be partitioned into 8 equal parts, until leaf nodes obtained through partitioning are 1×1×1 unit cubes, then points in the leaf nodes are arithmetically encoded to generate a binary geometric bitstream, namely a geometric bitstream. In a process of trisoup-based geometric information encoding, octree partitioning will also be performed first, but unlike the octree-based geometric information encoding, for the trisoup, a point cloud does not need to be partitioned step by step into unit cubes with a side length of 1×1×1, but partitioning is stopped when the point cloud is partitioned into blocks (sub-blocks) with a side length of W. Based on a surface formed by distribution of the point cloud in each block, at most twelve vertexes (intersection points) produced by the surface and twelve edges of the block are obtained, and the vertexes are arithmetically encoded (surface fitting based on intersection points) to generate a binary geometric bitstream, namely a geometric bitstream. Vertexes are also used for achieving a process of geometry reconstruction, and reconstructed geometric information is used when encoding attributes of the point cloud.

After geometric encoding is completed, geometric information is reconstructed, and attribute information encoding will depend on reconstructed geometric information. Specifically, in a process of attribute encoding, color conversion is performed firstly, and then color information (i.e. attribute information) is converted from a Red-Green-Blue (RGB) color space to a Luma-Chroma (YUV) color space. Then, the reconstructed geometric information is used for recoloring the point cloud, so that attribute information that is not encoded corresponds to the reconstructed geometric information. In a process of color information encoding, there are mainly two transform methods, one is distance-based lifting transform which depends on LOD partitioning, and the other is RAHT directly performed. In both of the two methods, color information is converted from a spatial domain to a frequency domain to obtain a high-frequency coefficient and a low-frequency coefficient through transform, and finally the coefficients are quantized (i.e., quantized coefficients). Finally, geometric encoding data after the octree partitioning and the surface fitting, and attribute encoding data processed through the quantized coefficients, are subjected to slice synthesis, and then vertex coordinates of each block are encoded in turn (i.e., arithmetic encoding) to generate a binary attribute bitstream, i.e., an attribute bitstream.

Figure 2:
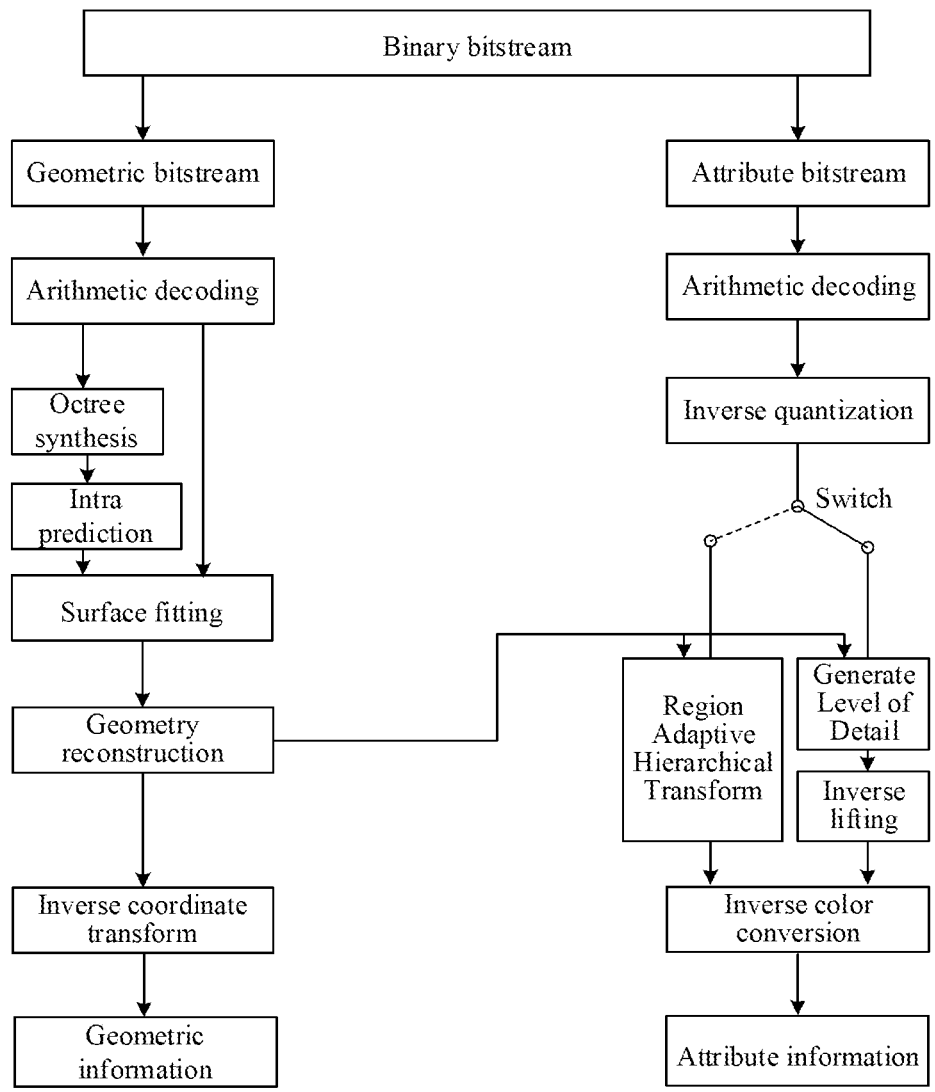
FIG. 2 is a flowchart of G-PCC decoding.

FIG. 2 is a flowchart of G-PCC decoding. As shown in FIG. 2, the flowchart of the G-PCC decoding is applied in a point cloud decoder. The decoder acquires a binary bitstream, and independently decodes a geometric bitstream and an attribute bitstream in the binary bitstream. When the geometric bitstream has been decoded, geometric information of a point cloud is obtained through arithmetic decoding—octree synthesis—surface fitting—geometry reconstruction—inverse coordinate transform. When the attribute bitstream has been decoded, attribute information of the point cloud is obtained through arithmetic decoding—inverse quantization—LOD-based inverse lifting, or through RAHT-based inverse transform—inverse color conversion. A 3D picture model of point cloud data to be encoded is restored based on the geometric information and the attribute information.

In intra prediction on the octree-based geometric information encoding, spatial correlation between a node to be predicted and neighboring nodes may be used for intra prediction on occupancy information of child nodes of the node to be predicted. Specifically, there are 26 neighboring nodes around the node to be predicted, and whether the child nodes of the node to be predicted are occupied may be predicted according to the occupancy information of the 26 neighboring nodes of the node to be predicted, that is, intra prediction. This method was proposed by BlackBerry in proposal m43600 in July, 2018, and accepted by MPEG G-PCC standard (that is, MPEG-I (ISO/IEC 23090) Part 9). This technical solution makes use of spatial correlation to make occupancy information more suitable for entropy encoding. Specific implementation description is as follows.

Firstly, when a quantity of layers partitioned through an octree is smaller than a preset quantity of layers L, an intra prediction function is enabled. 26 neighboring nodes around a node to be predicted may be determined by using a current layer level partitioned through the octree, a Morton 3D map used for mapping (x, y, z) coordinates and flag bits, and coordinates of an origin of the node to be predicted, and then occupancy information $\delta_k$ of a neighboring node k and a distance $d_{k,m}$ from the neighboring node k to a child node m of the node to be predicted may be determined, so that a weight value $W(d_{k,m}, \delta_k)$ corresponding to the child node m and the neighboring node k may be further determined by using a formula (1) based on $\delta_k$ and $d_{k,m}$.

$$W(d_{k,m}, \delta_k) = \begin{cases} W0(d_{k,m}), & \text{if } \delta_k = 0 \\ W1(d_{k,m}), & \text{if } \delta_k = 1 \end{cases} \quad (1)$$

All 26 neighboring nodes are traversed to obtain 26 weight values corresponding to the child node m, and an average value of these 26 weight values is obtained based on a formula (2), that is, an estimated value $score_m$ corresponding to the child node m is obtained.

$$score_m = \frac{1}{26}\sum_{k=1}^{26} W(d_{k,m}, \delta_k) \quad (2)$$

Whether the child node m is occupied or not is predicted by using two preset thresholds th0(No) and th1(No), and a prediction result is obtained.

In the above formula (2), values of $W0(d_{k,m})$, $W1(d_{k,m})$, th0(No), and th1(No) are all obtained through training, which are preset fixed values in the codec and do not need to be transmitted from an encoder to a decoder. No may represent a quantity of occupied nodes in all 26 neighboring nodes of the node to be predicted, and th0(No) is smaller than th1(No), that is, th0(No) may be a lower limit of the occupied nodes and th1(No) may be an upper limit of the occupied nodes.

Further, when th0(No) and th1(No) are used for predicting whether the child node m is occupied or not, the prediction result may include unoccupancy, occupancy, and unprediction. Specifically, when the estimated value $score_m$ is smaller than th0(No), it may be determined that the prediction result is unoccupancy; when the estimated value $score_m$ is greater than th1(No), it may be determined that the prediction result is occupancy; and when the estimated value $score_m$ is greater than th0(No) and smaller than th1(No), it may be determined that the prediction result is unprediction.

After obtaining the prediction result, the codec may output "whether to predict" and "predicted value" represented through 0 or 1 to be used in entropy encoding of occupancy information. Herein, "1 1" represents "occupancy"; "1 0" represents "unoccupancy"; and "0 0" represents "unprediction."

The flow, framework, and algorithm of this technical solution are exactly the same at the encoder and the decoder.

However, in the above-mentioned intra prediction technical solution of the octree-based geometric information encoding, although the occupancy information of 26 neighboring nodes around the node to be predicted is used for achieving the intra prediction on the occupancy information of the child node of the node to be predicted, occupancy information of one neighboring node cannot fully reflect occupancy information of 8 child nodes of the neighboring node, so spatial correlation of neighboring nodes cannot be fully utilized during intra prediction on a child node of a node to be predicted, thereby affecting accuracy of intra prediction and further reducing encoding efficiency.

Figure 4:
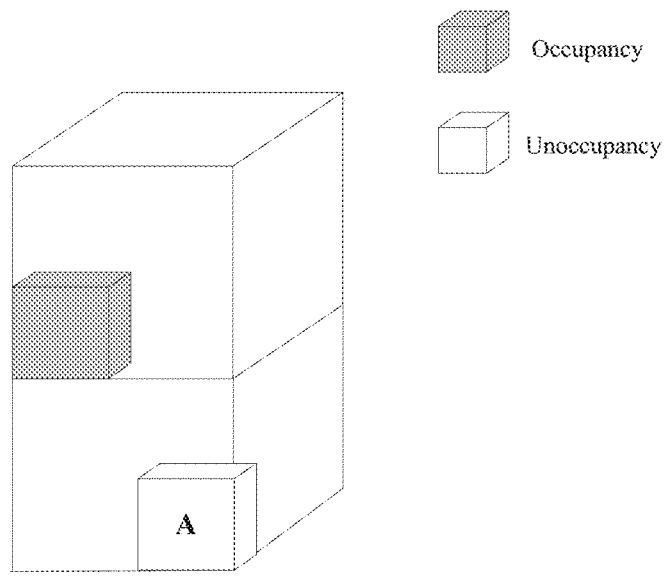
FIG. 4 is a first schematic diagram of child nodes of neighboring nodes.
Figure 5:
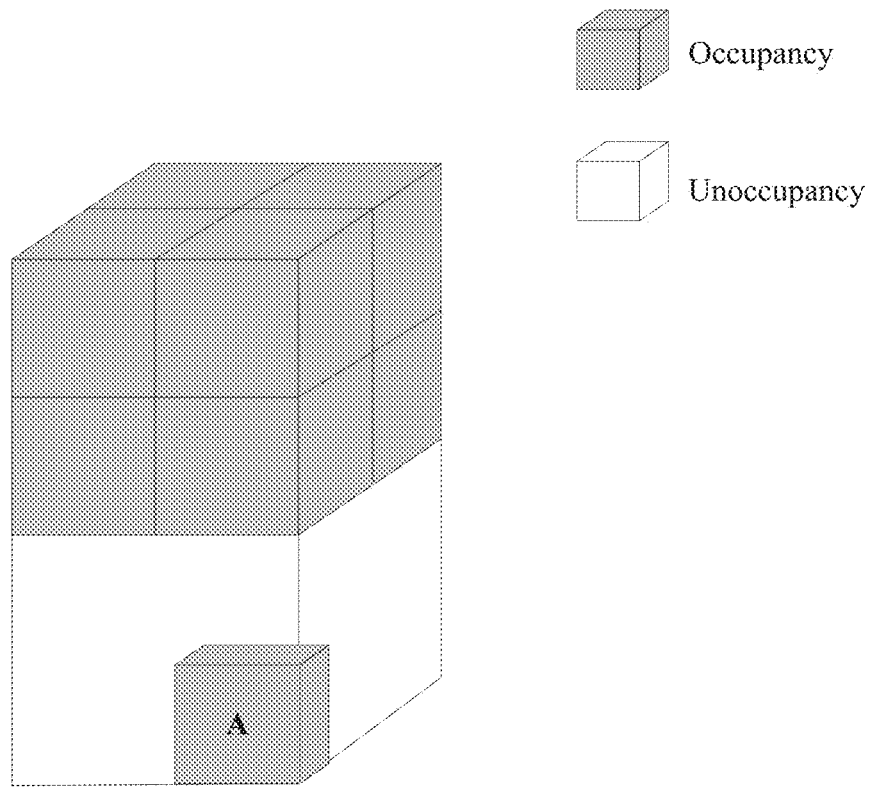
FIG. 5 is a second schematic diagram of child nodes of neighboring nodes.

It should be noted that in the present application, since there are several encoded (decoded) neighboring nodes in the 26 neighboring nodes, occupancy information of these encoded (decoded) neighboring nodes and occupancy information of corresponding child nodes are all known. FIG. 4 is a first schematic diagram of child nodes of neighboring nodes, and FIG. 5 is a second schematic diagram of child nodes of neighboring nodes. As shown in FIG. 4 and FIG. 5, when a child node in neighboring nodes has only one occupied node, a prediction result of occupancy information of a child node A in a node to be predicted is unoccupancy; when 8 child nodes in the neighboring nodes are all occupied nodes, the prediction result of the occupancy information of the child node A in the node to be predicted is occupancy, that is to say, when occupancy information of the node to be predicted is predicted, an influence on the child node of the node to be predicted in a case that one child node in the neighboring nodes is non-empty is different from that in a case that 8 child nodes in the neighboring nodes are non-empty. However, this is not considered in the existing intra prediction methods, which leads to insufficient utilization of spatial correlation and suppression of encoding efficiency.

In order to solve the above problems, in the method for predicting occupancy information proposed in the present application, when using occupancy information of neighboring nodes for intra prediction on occupancy information of a node to be predicted, a codec may introduce an encoding and decoding state of a neighboring node into a prediction process. Specifically, if the encoding and decoding state of the neighboring node indicates that the neighboring node has been encoded or decoded, an occupancy situation of a child node corresponding to the neighboring node may be added into a process of weight calculation and threshold comparison, so that spatial correlation of the neighboring nodes is fully utilized, thereby improving accuracy of intra prediction and further improving encoding efficiency.

That is to say, in the present application, a codec may introduce a set of new weight values in inter prediction according to occupancy information of child nodes of encoded and decoded neighboring nodes in 26 neighboring nodes around a node to be predicted. The weight values are related to a quantity of occupied nodes in the child nodes of the encoded and decoded neighboring nodes, so as to further utilize spatial correlation of a point cloud, reduce a bit rate, and keep a Peak Signal to Noise Ratio (PSNR) unchanged.

Further, the method for predicting occupancy information proposed in the present application may affect an intra prediction part in a G-PCC framework, and act on both an encoder and a decoder. The flow, framework, and algorithm of the method for predicting occupancy information are exactly the same at the encoder and the decoder.

Technical solutions in the embodiments of the present application will be clearly and completely described below in conjunction with the drawings in the embodiments of the present application.

Figure 6:
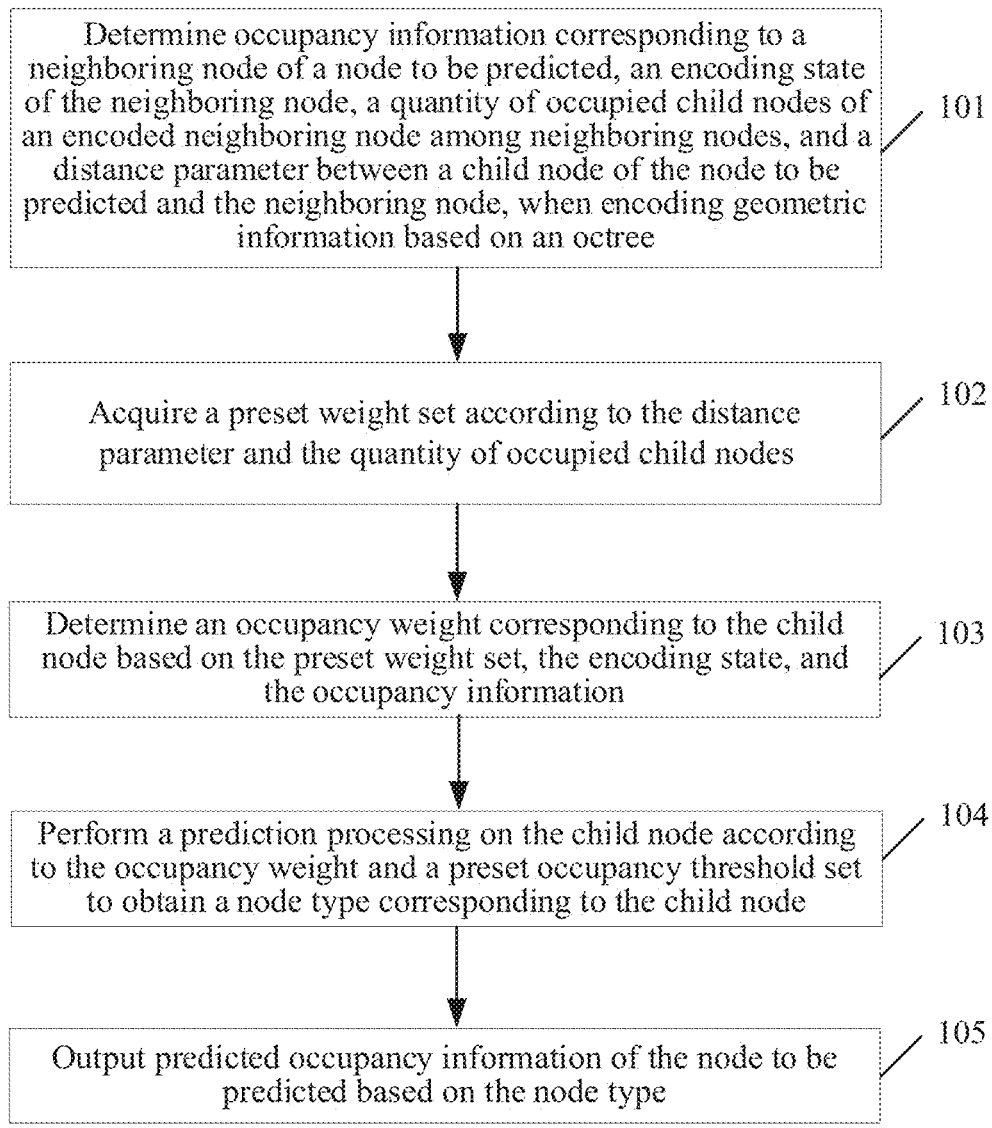
FIG. 6 is a first schematic diagram of an implementation flow of a method for predicting occupancy information.

An embodiment of the present application provides a method for predicting occupancy information, which is applied to an encoder. FIG. 6 is a first schematic diagram of an implementation flow of a method for predicting occupancy information. As shown in FIG. 6, in the present application, an act of predicting occupancy information by an encoder may include following acts.

In act 101, occupancy information corresponding to a neighboring node of a node to be predicted, an encoding state of the neighboring node, a quantity of occupied child nodes of an encoded neighboring node in neighboring nodes, and a distance parameter between a child node of the node to be predicted and a neighboring node is determined when encoding geometric information based on an octree.

In the embodiment of the present application, when encoding the geometric information based on the octree, the encoder may first determine the occupancy information corresponding to the neighboring node of the node to be predicted, the encoding state of the neighboring node, the quantity of occupied child nodes of the encoded neighboring node in neighboring nodes, and also determine the distance parameter between the child node of the node to be predicted and the neighboring node at the same time.

It should be noted that in the embodiment of the present application, in a G-PCC encoder framework for a point cloud, geometric information encoding may be partitioned into two kinds of frameworks according to different layer level depths of octree partitioning: an octree-based geometric information encoding framework and a trisoup-based geometric information encoding framework.

Further, in the embodiment of the present application, in the framework of octree-based geometric information encoding, a bounding box may be equally partitioned into 8 sub-cubes firstly, and occupancy information of each cube may be recorded, and then a non-empty sub-cube is continued to be partitioned into 8 equal parts until leaf nodes obtained through partitioning are 1×1×1 unit cubes. In this process, the encoder may utilize spatial correlation between a node and surrounding nodes to perform intra prediction on occupancy information, and finally entropy encoding is performed to generate a binary bitstream.

It should be noted that in the embodiment of the present application, an intra prediction function is not always turned on, but the encoder can only enable the intra prediction function after a partitioned layer level meets a condition. Specifically, in the embodiment of the present application, the encoder may first determine a current layer level, and then compare the current layer level with a preset layer quantity threshold, and determine whether to enable the intra prediction function according to a comparison result.

Further, in the embodiment of the present application, the current layer level determined by the encoder may be used for characterizing a current quantity of layers obtained when performing octree partitioning. Further, after comparing the current layer level with the preset threshold of the quantity of layers, the encoder may enable the intra prediction function if the comparison result is that the current layer level is greater than or equal to the preset threshold of the quantity of layers. The encoder may not enable the intra prediction function if the comparison result is that the current layer level is smaller than the preset threshold of the quantity of layers.

It should be noted that in the embodiment of the present application, when encoding geometric information based on an octree, the encoder needs to perform intra prediction only if a quantity of layers obtained through octree partitioning is not smaller than a preset layer quantity threshold. The preset threshold of the quantity of layers may be an integer greater than 1, and exemplarily, the preset layer quantity threshold may be set to 6.

Further, in the embodiment of the present application, when encoding the geometric information based on the octree, the encoder may determine occupancy information and encoding states of neighboring nodes around a node to be predicted after the intra prediction function is enabled, and at the same time, may also determine a distance parameter between a child node of the node to be predicted and a neighboring node. Herein, since the encoder performs octree partitioning, there are 26 neighboring nodes around the node to be predicted, and 8 child nodes may be obtained by continuing to perform octree partitioning on the node to be predicted, that is to say, in the present application, the child nodes of the node to be predicted are 8 child nodes obtained through octree partitioning on the node to be predicted.

It should be noted that in the embodiment of the present application, since there are 26 neighboring nodes around the node to be predicted and the node to be predicted includes 8 child nodes, the encoder may detect and obtain 26 pieces of occupancy information and 26 encoding states corresponding to the 26 neighboring nodes, and at the same time, for each of the 8 child nodes, there is a corresponding distance parameter characterizing a distance from the 26 neighboring nodes.

Further, in the embodiment of the present application, the occupancy information of the neighboring nodes may be used for characterizing whether the neighboring nodes are occupied, specifically, the occupancy information may indicate occupancy or unoccupancy, that is, it may be non-empty or empty. Herein, occupancy (non-empty) may be expressed as 1, and unoccupancy (empty) may be expressed as 0.

It should be noted that in the embodiment of the present application, an encoding state is used for determining whether a neighboring node has been encoded, so the encoding state may indicate that it has been encoded or not encoded. Further, in the present application, for a neighboring node whose encoding state indicate that it has been encoded, the neighboring node has 8 child nodes, so the encoding state may also be used for determining whether a neighboring node has a child node.

Further, in the embodiment of the present application, for an encoded neighboring node, that is, an encoded neighboring node in neighboring nodes, the encoder may further determine occupancy information corresponding to 8 child nodes of the neighboring node, so as to determine how many occupied child nodes are present in the 8 child nodes of the neighboring node, that is, determine a quantity of occupied child nodes corresponding to the encoded neighboring node in the neighboring nodes.

It should be noted that in the embodiment of the present application, when determining occupancy information corresponding to a neighboring node of a node to be predicted and a distance parameter between a child node of the node to be predicted and the neighboring node, the encoder may specifically determine occupancy information and a distance parameter according to a layer level parameter of the node to be predicted, a pre-stored Morton 3D map, and coordinates of an origin of the node to be predicted. That is to say, the encoder may input the layer level parameter of the node to be predicted, the pre-stored Morton 3D map, and the coordinates of the origin of the node to be predicted in a point cloud respectively, so that the occupancy information corresponding to the neighboring node and the distance parameter between the child node of the node to be predicted and the neighboring node may be determined.

It may be understood that in the embodiment of the present application, the pre-stored Morton 3D map may be used for mapping (x, y, z) coordinates and flag bits. Specifically, the encoder may determine the pre-stored Morton 3D map by using Morton codes based on the (x, y, z) coordinates of the point cloud.

In act 102, a preset weight set is acquired according to the distance parameter and the quantity of occupied child nodes.

In the embodiment of the present application, after determining the distance parameter between the child node of the node to be predicted and the neighboring node, the encoder may acquire the preset weight set according to the distance parameter and the quantity of occupied child nodes.

It should be noted that in the embodiment of the present application, the preset weight set may include a first weight, a second weight, and a third weight. Specifically, the preset weight set corresponds to the distance parameter and the quantity of occupied child nodes, wherein both the first weight and the second weight correspond to the distance parameter and the third weight corresponds to the quantity of occupied child nodes.

Further, in the embodiment of the present application, the first weight, the second weight, and the third weight may be used for predicting occupancy information of a child node of the node to be predicted under different conditions and circumstances. Herein, the first weight, the second weight, and the third weight are all obtained through learning and training, and they are preset fixed values in the encoder, and do not need to be transmitted from an encoder to a decoder.

It should be noted that in the embodiment of the present application, although both the first weight and the second weight correspond to the distance parameter, the first weight and the second weight obtained through learning and training have different values.

It may be understood that in the embodiment of the present application, for 8 child nodes of the node to be predicted, each child node corresponds to 26 neighboring nodes and has 26 distance parameters, so each child node has 26 preset weight sets.

In act 103, an occupancy weight corresponding to the child node is determined based on preset weight sets, encoding states, and occupancy information.

In the embodiment of the present application, after determining the occupancy information and the encoding state corresponding to the neighboring node and simultaneously acquiring the preset weight set corresponding to the distance parameter and the quantity of occupied child nodes, the encoder may further determine the occupancy weight corresponding to the child node of the node to be predicted according to the preset weight set, the encoding state, and the occupancy information.

It should be noted that in the embodiment of the present application, after determining the encoding state and the occupancy information corresponding to the neighboring node, the encoder may select a calculation method of the occupancy weight of the child node based on the encoding state and occupancy information. Specifically, whether a neighboring node is occupied or not and whether the neighboring node has been encoded will all have an impact on the calculation method of the occupancy weight of the child node.

Further, in the embodiment of the present application, if the occupancy information of the neighboring node indicates unoccupancy, then the occupancy weight of the child node may be directly determined by using the first weight in the preset weight set.

Further, in the embodiment of the present application, if the occupancy information of the neighboring node indicates occupancy and the encoding state of the neighboring node indicates encoded, then the occupancy weight of the child node may be directly determined by using the second weight and the third weight in the preset weight set.

Further, in the embodiment of the present application, if the occupancy information of the neighboring node indicates occupancy and the encoding state of the neighboring node indicates uncoded, then the occupancy weight of the child node may be directly determined by using the second weight in the preset weight set.

It should be noted that in the embodiment of the present application, for 8 child nodes of the node to be predicted, each child node corresponds to 26 neighboring nodes and has 26 distance parameters, and each child node corresponds to 26 preset weight sets. Therefore, for each child node, the encoder may calculate and obtain 26 weight parameters corresponding to 26 neighboring nodes by using the 26 preset weight sets, so that an occupancy weight of the child node may be calculated based on the 26 weight parameters.

It may be understood that in the embodiment of the present application, the encoder may use a following formula (3) to calculate a weight parameter W ($d_{k,m}$, $\delta_k$, $n_k$) of an m-th child node m based on an encoding state and occupancy information $\partial_k$ corresponding to a k-th neighboring node k of the node to be predicted.

$$W(d_{k,m}, \delta_k, n_k) = \begin{cases} W0(d_{k,m}) & \text{if } \delta_k = 0 \\ W1(d_{k,m}) \times W(n_k) & \text{if } \delta_k = 1, \text{ encoded} \\ W1(d_{k,m}) & \text{if } \delta_k = 1, \text{ not encoded} \end{cases} \quad (3)$$

A value of k is 1, 2, . . . , and 26, and a value of m is 1, 2, . . . , and 8, and $d_{k,m}$ is a distance parameter between the neighboring node k and the child node m of the node to be predicted. If the encoding state of the neighboring node k indicates encoded, a quantity of occupied child nodes of the encoded neighboring node k in 8 child nodes of the neighboring node k is $n_k$. $W0(d_{k,m})$ is a first weight, $W1(d_{k,m})$ is a second weight, and $W(n_k)$ is a third weight. It may be seen that both the first weight $W0(d_{k,m})$ and the second weight $W_1(d_{k,m})$ are related to $d_{k,m}$, and the third weight $W(n_k)$ is related to $n_k$.

Further, in the embodiment of the present application, after calculating and obtaining all 26 weight parameters $W(d_{k,m}, \delta_k, n_k)$ of a child node, the encoder may calculate an average value of all 26 weight parameters by a formula (4), so as to obtain an occupancy weight $score_m$ corresponding to the child node.

$$score_m = \frac{1}{26} \sum_{k=1}^{26} W(d_{k,m}, \delta_k, n_k) \quad (4)$$

It may be understood that in the embodiment of the present application, according to whether a neighboring node has been encoded and occupied, the encoder may calculate and obtain an occupancy weight of a child node of a node to be predicted according to different calculation methods based on a preset weight set. When the neighboring node has been occupied and encoded, the encoder may further determine the occupancy weight of the child node of the node to be predicted by using a quantity of occupied child nodes of the encoded neighboring node.

In the embodiment of the present application, further, when determining an occupancy weight according to the second weight and the third weight, the encoder may first correct the third weight by using a preset correlation coefficient to obtain a corrected weight; and then determine an occupancy weight according to the second weight and the corrected weight.

Specifically, in the embodiment of the present application, for the third weight corresponding to a quantity of occupied child nodes, the encoder may add a preset correlation coefficient related to a quantization parameter for correction, so as to bring more significant gains to the codec under different quantization degrees. Based on the above formula (3), the encoder may use a formula (5) to correct the third weight W ($n_k$) to obtain a corrected weight $\tilde{W}(n_k)$.

$$\tilde{W}(n_k) = W(n_k) \times \alpha \quad (5)$$

Wherein $\alpha$ is the preset correlation coefficient related to the quantization parameter.

It should be noted that in the embodiment of the present application, the preset correlation coefficient needs to be signalled in a binary bitstream output by the encoder as an input of a decoder, so that a same correction is made to the third weight at a decoder.

In act 104, a prediction processing is performed on the child node according to the occupancy weight and a preset occupancy threshold set to obtain a node type corresponding to the child node.

In the embodiment of the present application, after determining the occupancy weight corresponding to the child node based on the preset weight set, the encoding state, and occupancy information, the encoder may perform the prediction processing on the child node according to the occupancy weight and the preset occupancy threshold set, so as to obtain the node type corresponding to the child node.

Further, in the embodiment of the present application, the encoder may first obtain the preset occupancy threshold set, wherein the preset occupancy threshold set includes a first threshold and a second threshold, specifically the first threshold is smaller than the second threshold.

It should be noted that in the embodiment of the present application, both the first threshold and the second threshold correspond to a quantity of occupied neighboring nodes in neighboring nodes. Therefore, before performing the prediction processing on the child node according to the occupancy weight and the preset occupancy threshold set to obtain the node type corresponding to the child node, the encoder may first determine a quantity of nodes whose occupancy information indicates occupancy, in the neighboring nodes, that is, determine a quantity of occupied neighboring nodes in the neighboring nodes.

Further, in the embodiment of the present application, after determining the quantity of occupied neighboring nodes in the neighboring nodes, the encoder may determine the first threshold and the second threshold corresponding to the quantity of occupied neighboring nodes from the preset occupancy threshold set.

It should be noted that in the embodiment of the present application, the node type of the child node of the node to be predicted may include three types: occupancy, unoccupancy, and unprediction, in which, occupancy characterizes that a prediction result of occupancy information of the child node indicates occupancy; unoccupancy characterizes that a prediction result of occupancy information of the child node indicates unoccupancy; unprediction characterizes that prediction of occupancy information on the child node is not performed.

Further, in the embodiment of the present application, the encoder may output "whether to predict" and "predicted value" represented through 0 or 1 to be used in subsequent entropy encoding of occupancy information. Herein, "1 1" may represent "occupancy"; "1 0" may represent "unoccupancy"; and "0 0" may represent "unprediction".

It should be noted that in the embodiment of the present application, when performing the prediction processing on the child node according to the occupancy weight and the preset occupancy threshold set, the encoder may compare the occupancy weight with the first threshold and the second threshold respectively to obtain a comparison result, so as to achieve prediction on the child node of the node to be predicted according to the comparison result to obtain the node type of the child node of the node to be predicted.

Further, in the embodiment of the present application, after comparing the occupancy weights with the first threshold and the second threshold respectively, the encoder may determine the node type as unoccupancy if the comparison result is that the occupancy weight is smaller than the first threshold.

Further, in the embodiment of the present application, after comparing the occupancy weight with the first threshold and the second threshold respectively, the encoder may determine the node type as occupancy if the comparison result is that the occupancy weight is greater than the second threshold.

Further, in the embodiment of the present application, after comparing the occupancy weights with the first threshold and the second threshold respectively, the encoder may determine the node type as unprediction if the comparison result is that the occupancy weight is greater than or equal to the first threshold and smaller than or equal to the second threshold.

It should be noted that in the embodiment of the present application, when the occupancy weight is greater than or equal to the first threshold and smaller than or equal to the second threshold, the encoder cannot perform prediction of occupancy information on the child node based on the first weight, the second weight, and the third weight, so it may determine the node type of the child node as unprediction.

Further, in the embodiment of the present application, both the first threshold and the second threshold are obtained through learning and training, and they are preset fixed values in the encoder, and do not need to be transmitted from the encoder to the decoder.

In act 105, predicted occupancy information of the node to be predicted is output based on node types.

In the embodiment of the present application, after performing the prediction processing on the child node according to the occupancy weight and the preset occupancy threshold set to obtain the node type corresponding to the child node, the encoder may output the predicted occupancy information of the node to be predicted based on node types.

It should be noted that in the embodiment of the present application, the predicted occupancy information of the node to be predicted includes 8 node types corresponding to all 8 child nodes of the node to be predicted.

Further, in the embodiment of the present application, for any child node of the node to be predicted, the encoder may perform prediction of occupancy information on the child node according to 26 neighboring nodes around the node to be predicted by using the above-mentioned method from act 101 to act 104, so as to obtain the node type corresponding to the child node. Specifically, the encoder may first determine 26 weight parameters corresponding to the child node by using occupancy information of a neighboring node of the 26 neighboring nodes, an encoding state of the neighboring node, and a distance parameter between the neighboring node and the child node, then calculate an average value of the 26 weight parameters corresponding to the child node to obtain an occupancy weight corresponding to the child node, and then determine the node type corresponding to the child node by comparing the occupancy weight with the preset occupancy threshold set.

It should be noted that in the embodiment of the present application, the predicted occupancy information of the node to be predicted output by the encoder based on node types is the occupancy information of the node to be predicted obtained by performing prediction of occupancy information on all 8 child nodes of the node to be predicted based on the above-mentioned method of act 101 to act 104 to complete prediction on occupancy information of the node to be predicted.

It may be understood that in the embodiment of the present application, the encoder may traverse all 8 child nodes of the node to be predicted until all 8 node types corresponding to all 8 child nodes of the node to be predicted are determined, and finally output predicted occupancy information of the node to be predicted by using all the 8 node types.

It should be noted that in the embodiment of the present application, after outputting the predicted occupancy information of the node to be predicted based on node types, the encoder may perform an encoding processing of geometric information on the node to be predicted according to the predicted occupancy information to obtain bitstream data, wherein the bitstream data may be a binary bitstream.

In the embodiment of the present application, further, before determining the occupancy information corresponding to the neighboring node of the node to be predicted, the encoding state of the neighboring node, and the distance parameter between the child node of the node to be predicted and the neighboring node, the encoder may also first determine a point cloud sequence type corresponding to the node to be predicted, and then acquire a preset weight set and a preset occupancy threshold set corresponding to the point cloud sequence type.

That is to say, in the embodiment of the present application, for different point cloud sequence types, the encoder may perform prediction of occupancy information on the node to be predicted by using different preset weight sets and preset occupancy threshold sets. That is, when performing prediction of occupancy information on the node to be predicted, the first weight, the second weight, the third weight, the first threshold, and the second threshold used by the encoder are matched with the point cloud sequence type corresponding to the node to be predicted, so as to achieve higher gains when compressing point clouds of different point cloud sequence types.

Exemplarily, a scaling ratio r between a point cloud sequence space and an actual space is introduced, and an actual density p of a point cloud is calculated according to r and a length 1, a width w, and a height h of a bounding box, that is as follows.

$$\begin{cases} l = l_{bbox} \div r, \\ w = w_{bbox} \div r \\ h = h_{bbox} \div r \end{cases} \quad (6)$$

$$\rho = \frac{N}{l \times w \times h} \quad (7)$$

According to the actual density, point cloud sequence types may be partitioned into three types: sparse, medium, and dense. And the first weight, the second weight, the third weight, the first threshold, and the second threshold are respectively trained for the three different point cloud sequence types.

It should be noted that in the embodiment of the present application, the point cloud sequence type needs to be signalled in a binary bitstream output by the encoder as an input of a decoder, so that a matched preset weight set and preset occupancy threshold set may be selected at the decoder to perform same intra prediction as the encoder.

The embodiment of the present application provides a method for predicting occupancy information. When encoding geometric information based on an octree, an encoder determines occupancy information corresponding to a neighboring node of a node to be predicted, an encoding state of the neighboring node, a quantity of occupied child nodes of an encoded neighboring node in neighboring nodes, and a distance parameter between a child node of the node to be predicted and the neighboring node; acquires a preset weight set according to the distance parameter and the quantity of the occupied child nodes; determines an occupancy weight corresponding to the child node based on the preset weight set, the encoding state, and the occupancy information; performs a prediction processing on the child node according to the occupancy weight and a preset occupancy threshold set to obtain a node type corresponding to the child node; and outputs predicted occupancy information of the node to be predicted based on node types. It may be seen that in the embodiment of the present application, when using occupancy information of a neighboring node for intra prediction of occupancy information on a node to be predicted, a codec may introduce an encoding and decoding state of the neighboring node into a prediction process. Specifically, if the encoding and decoding state of the neighboring node indicates encoded or decoded, an occupancy situation of a child node corresponding to the neighboring node may be added into a process of weight calculation and threshold comparison, so that spatial correlation of neighboring nodes is fully utilized, thereby improving accuracy of intra prediction and further improving encoding efficiency.

Figure 7:
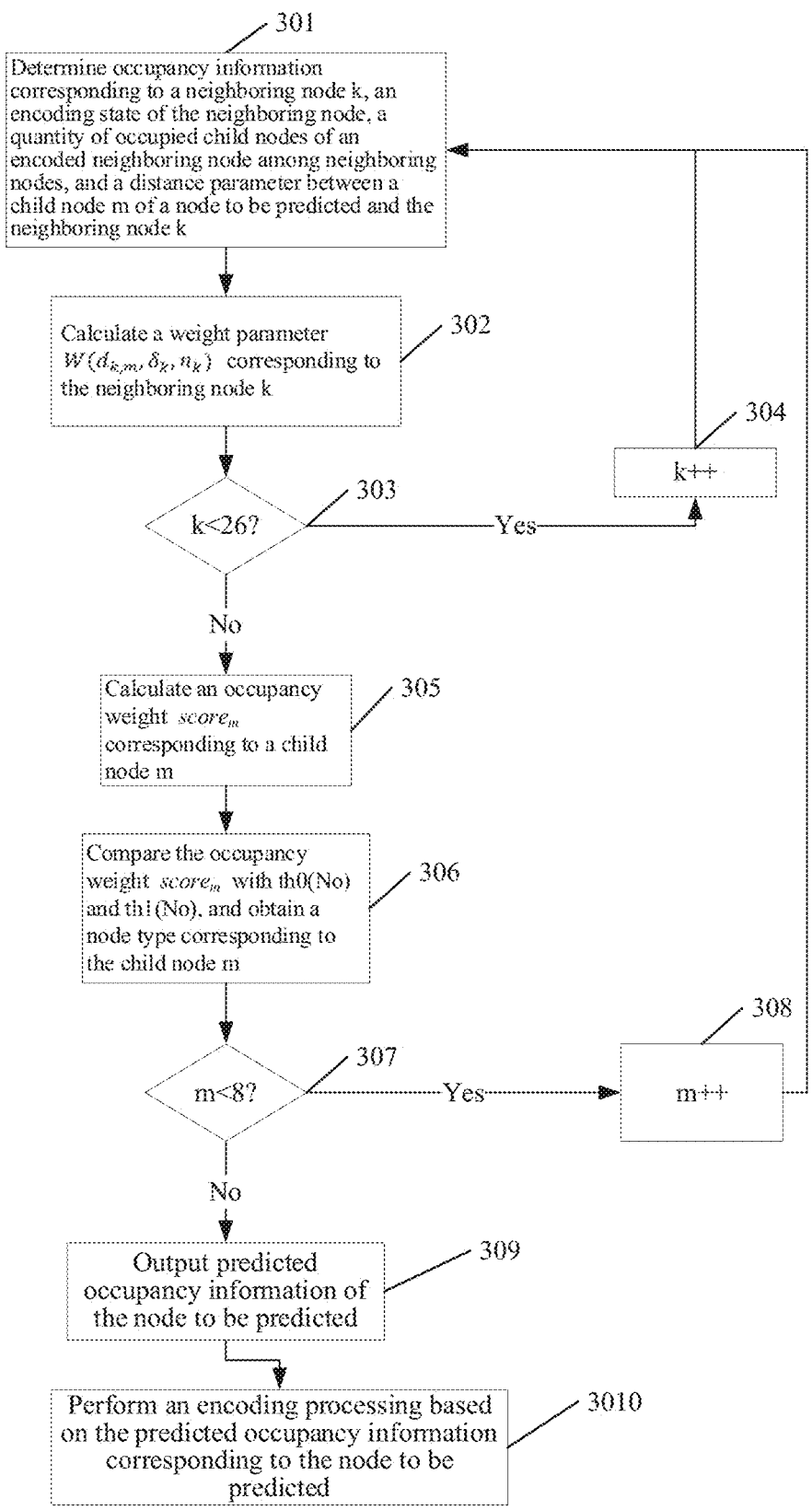
FIG. 7 is a flowchart of an intra prediction framework of occupancy information.

Based on the above embodiments, in another embodiment of the present application, FIG. 7 is a flowchart of an intra prediction framework of occupancy information. As shown in FIG. 7, when encoding geometric information based on an octree, when performing intra prediction of occupancy information on a node to be predicted, an encoder may input a layer level corresponding to the node to be predicted, a preset Morton 3D map, and coordinates of an origin of the node to be predicted, and then determine occupancy information $\delta_k$ corresponding to a neighboring node k of the node to be predicted, an encoding state of the neighboring node, a quantity $n_k$ of occupied child nodes of an encoded neighboring node in neighboring nodes, and a distance parameter $d_{on}$ between a child node m of the node to be predicted and the neighboring node k based on the layer level corresponding to the node to be predicted, the preset Morton 3D map, and the coordinates of the origin of the node to be predicted (act 301); and then calculate a weight parameter $W(d_{k,m}, \delta_k)$ corresponding to a k-th neighboring node k by using the above formula (3) based on $n_k$, $d_{k,m}$, a first weight $W0(d_{k,m})$, the second weight W1 $(d_{k,m})$, and the third weight $W(n_k)$ (act 302); and after traversing all 26 neighboring nodes of the node to be predicted, obtain 26 weight parameters corresponding to a child node m (act 303 and act 304); calculate an average value of the 26 weight parameters by using the above formula (4) to obtain an occupancy weight score$_m$, corresponding to the child node m (act 305). A quantity of occupied neighboring nodes in all 26 neighboring nodes is No, and thresholds corresponding to the quantity No of occupied neighboring nodes in a preset occupancy threshold set are a first threshold th0(No) and a second threshold th1(No); by comparing the occupancy weight score$_m$, with the first threshold th0(No) and the second threshold th1(No) respectively, the encoder achieves prediction of occupancy information of the child node m, and obtains a node type corresponding to the child node m (act 306); traverses all 8 child nodes of the node to be predicted to determine a node type corresponding to each child node of the node to be predicted (act 307 and act 308); and finally outputs predicted occupancy information of the node to be predicted based on all 8 node types corresponding to all 8 child nodes (act 309), and finally performs an encoding processing based on the predicted occupancy information corresponding to the node to be predicted to obtain bitstream data (act 3010).

Figure 8:
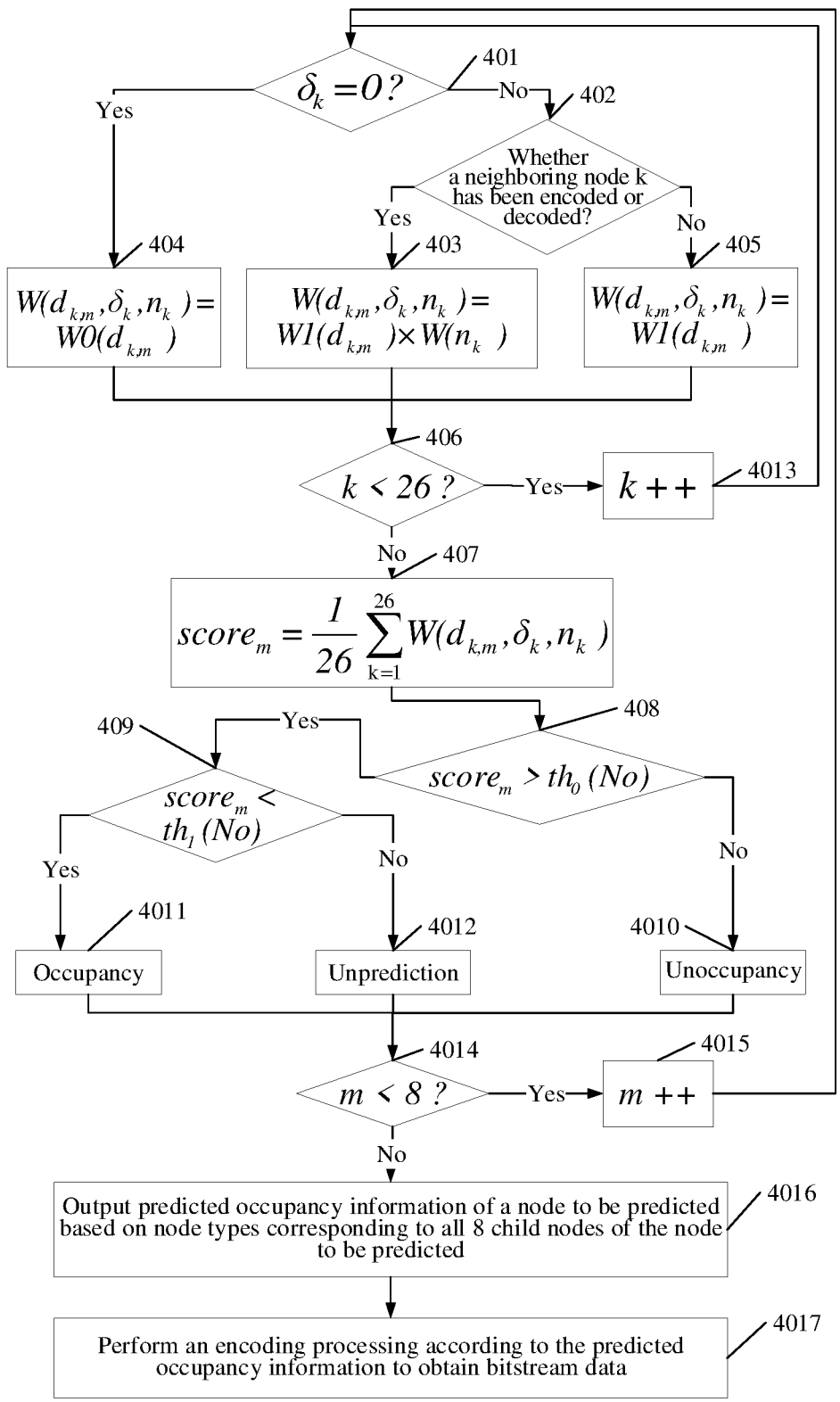
FIG. 8 is a flowchart of an intra prediction algorithm of occupancy information.

FIG. 8 is a flowchart of an intra prediction algorithm of occupancy information. As shown in FIG. 8, when encoding geometric information based on an octree, following acts may be specifically included when an encoder is performing intra prediction of occupancy information on a node to be predicted.

In act 401, when k=1 and m=1, it is determined whether occupancy information $\delta_k$ corresponding to a k-th neighboring node k of a node to be predicted is 0, that is, it is determined whether the neighboring node k is occupied or not, it is not occupied if $\delta_k$ is 0, and it is occupied if $\delta_k$ is not 0; if $\delta_k$ is 0, act 404 is executed; otherwise, act 402 is executed.

In act 402, an encoding state of the neighboring node k is determined, that is, it is determined whether the neighboring node k has been encoded, if yes, then act 403 is executed, otherwise, act 405 is executed.

In act 403, a weight parameter $W(d_{k,m}, \delta_k, n_k)$ corresponding to the neighboring node k and an m-th child node m of the node to be predicted is calculated and obtained by using a second weight $W1(d_{k,m})$ and a third weight $W(n_k)$. Herein, $d_{k,m}$ is a distance parameter between the child node m and the neighboring node k, and $n_k$ is a quantity of occupied child nodes of an encoded neighboring node.

In act 404, a weight parameter $W(d_{k,m}, \delta_k, n_k)$ corresponding to the neighboring node k and a child node m is calculated and obtained by using a first weight $W0(d_{k,m})$.

In act 405, a weight parameter $W(d_{k,m}, \delta_k, n_k)$ corresponding to the neighboring node k and a child node m is calculated and obtained by using a second weight $W1(d_{k,m})$.

In act 406, it is determined whether k is smaller than 26, that is, it is determined whether all 26 neighboring nodes of the node to be predicted are traversed; if not, act 407 is executed; otherwise, act 4013 is executed.

In act 407, an average calculation is performed on all 26 weight parameters $W(d_{k,m}, \delta_k, n_k)$ corresponding to the child node m to obtain an occupancy weight $score_m$.

In act 408, it is determined whether the occupancy weight $score_m$ is greater than a first threshold th0(No), wherein No is a quantity of occupied neighboring nodes in 26 neighboring nodes; if not, act 4010 is executed; if yes, act 409 is executed.

In act 409, it is determined whether the occupancy weight $score_m$ is smaller than a second threshold th1(No), if yes, act 4011 is executed, if not, act 4012 is executed.

In act 4010, a node type of the child node m is determined to be non-occupied, that is, occupancy information of the child node m is predicted to be unoccupancy.

In act 4011, a node type of the child node m is determined to be occupied, that is, occupancy information of the child node m is predicted to be occupancy.

In act 4012, occupancy information of the child node m is not predicted.

In act 4013, k is incremented by 1, and act 401 is continued to be executed.

In act 4014, it is determined whether m is smaller than 8, that is, it is determined whether all 8 child nodes of the node to be predicted are traversed; if yes, act 4016 is executed; if not, act 4015 is executed.

In act 4015, m is incremented by 1, and act 401 is executed.

In act 4016, predicted occupancy information of the node to be predicted is output based on node types corresponding to all 8 child nodes of the node to be predicted.

In act 4017, an encoding processing is performed according to the predicted occupancy information to obtain bitstream data.

In the embodiment of the present application, further, the method for predicting occupancy information proposed in the present application may further utilize spatial correlation of a point cloud, so that an intra prediction result of octree-based geometric information encoding is more suitable for entropy encoding, thereby reducing a bit rate of a binary bitstream and achieving a higher gain. Table 1 shows a bit rate saving situation Bjntegaard-Delta rate (BD-Rate) of the method for predicting occupancy information proposed in the present application under lossy compression, in which, as may be seen from Table 1, for different targets, under same objective quality, a bit rate is reduced by using the method for predicting occupancy information proposed in the present application. Herein, when a BD-rate is a negative value, it is characterized that a bit rate is reduced and performance is improved; when a BD-rate is a positive value, it is characterized that a bit rate is increased and performance is degraded.

TABLE 1

|  | Geometry BD-TotalRate(%) | | End-to-end BD-TotalRate(%) | | |
| --- | --- | --- | --- | --- | --- |
|  | D1 | D2 | Y | U | V |
| Basketball | −1.3% | −1.3% | −1.3% | −1.3% | −1.3% |
| Boxer | −0.9% | −0.9% | −1.0% | −1.1% | −1.1% |
| Dancer | −1.1% | −1.1% | −1.1% | −1.1% | −1.1% |
| Long skirt | −0.6% | −0.6% | −0.7% | −0.7% | −0.7% |
| Money | −1.3% | −1.3% | −1.3% | −1.3% | −1.3% |
| Queen | −1.2% | −1.2% | −1.1% | −1.1% | −1.1% |
| Reddish black | −0.9% | −0.9% | −0.9% | −0.9% | −0.9% |
| Soldier | −1.1% | −1.1% | −1.2% | −1.1% | −1.2% |
| Snorer | −0.7% | −0.7% | −0.7% | −0.7% | −0.7% |
| Average | −1.01% | −1.01% | −1.03% | −1.03% | −1.04% |

An embodiment of the present application provides a method for predicting occupancy information. When encoding geometric information based on an octree, an encoder determines occupancy information corresponding to a neighboring node of a node to be predicted, an encoding state of the neighboring node, a quantity of occupied child nodes of an encoded neighboring node in neighboring nodes, and a distance parameter between a child node of the node to be predicted and the neighboring node; acquires a preset weight set according to the distance parameter and the quantity of the occupied child nodes; determines an occupancy weight corresponding to the child node based on the preset weight set, the encoding state, and the occupancy information; performs a prediction processing on the child node according to the occupancy weight and a preset occupancy threshold set to obtain a node type corresponding to the child node; and outputs predicted occupancy information of the node to be predicted based on node types. It may be seen that in the embodiment of the present application, when using occupancy information of a neighboring node for intra prediction of occupancy information on a node to be predicted, a codec may introduce an encoding and decoding state of the neighboring node into a prediction process. Specifically, if the encoding and decoding state of the neighboring node indicates encoded or decoded, an occupancy situation of a child node corresponding to the neighboring node may be added into a process of weight calculation and threshold comparison, so that spatial correlation of neighboring nodes is fully utilized, thereby improving accuracy of intra prediction and further improving encoding efficiency.

Figure 9:
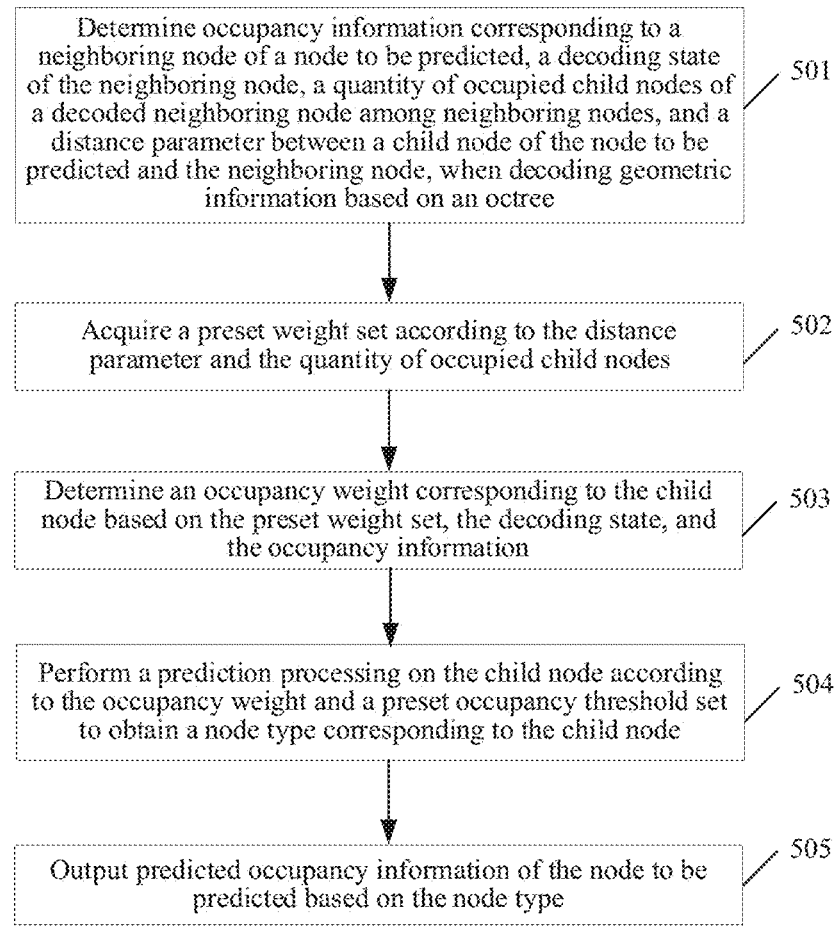
FIG. 9 is a second schematic diagram of an implementation flow of a method for predicting occupancy information.

An embodiment of the present application provides a method for predicting occupancy information, which is applied to a decoder. FIG. 9 is a second schematic diagram of an implementation flow of a method for predicting occupancy information. As shown in FIG. 9, acts of predicting occupancy information by a decoder may include following acts.

In act 501, when decoding geometric information based on an octree, occupancy information corresponding to a neighboring node of a node to be predicted, a decoding state of the neighboring node, a quantity of occupied child nodes of a decoded neighboring node in neighboring nodes, and a distance parameter between a child node of the node to be predicted and the neighboring node is determined.

In the embodiment of the present application, when decoding the geometric information based on the octree, the decoder may first determine the occupancy information corresponding to the neighboring node of the node to be predicted, the decoding state of the neighboring node, the quantity of occupied child nodes of the decoded neighboring node in the neighboring nodes, and also determine the distance parameter between the child node of the node to be predicted and the neighboring node at the same time.

It should be noted that in the embodiment of the present application, in a G-PCC decoder framework of a point cloud, geometric information decoding may be partitioned into two kinds of frameworks according to different layer level depths of octree partitioning: an octree-based geometric information encoding framework and a trisoup-based geometric information encoding framework.

Further, in the embodiment of the present application, in the framework of octree-based geometric information decoding, a bounding box may be equally partitioned into 8 sub-cubes firstly, and occupancy information of each cube may be recorded, and then a non-empty sub-cube may be continued to be partitioned into 8 equal parts until leaf nodes obtained through partitioning are 1×1×1 unit cubes. In this process, the decoder may utilize spatial correlation between a node and surrounding nodes to perform intra prediction on occupancy information.

It should be noted that in the embodiment of the present application, an intra prediction function is not always turned on, but the decoder can only enable the intra prediction function after a partitioned layer level meets a condition. Specifically, in the embodiment of the present application, the decoder may first determine a current layer level, and then compare the current layer level with a preset layer quantity threshold, and determine whether to enable the intra prediction function according to a comparison result.

Further, in the embodiment of the present application, the current layer level determined by the decoder may be used for characterizing a current quantity of layers obtained through octree partitioning. Further, after comparing the current layer level with the preset threshold of the quantity of layers, the decoder may enable the intra prediction function if the comparison result is that the current layer level is greater than or equal to the preset threshold of the quantity of layers. The decoder may not enable the intra prediction function if the comparison result is that the current layer level is smaller than the preset threshold of the quantity of layers.

It should be noted that in the embodiment of the present application, when decoding geometric information based on an octree, a decoder needs to perform intra prediction only if a quantity of layers obtained through octree partitioning is not smaller than a preset threshold of the quantity of layers. The preset threshold of the quantity of layers may be an integer greater than 1, and exemplarily, the preset threshold of the quantity of layers may be set to 6. Further, in the embodiment of the present application, when decoding the geometric information based on the octree, the decoder may determine occupancy information and a decoding state of a neighboring node around a node to be predicted after an intra prediction function is enabled, and at the same time, may also determine a distance parameter between a child node of the node to be predicted and the neighboring node. Herein, since the decoder performs octree partitioning, there are 26 neighboring nodes around the node to be predicted, and 8 child nodes may be obtained by continuing to perform octree partitioning on the node to be predicted, that is to say, in the present application, child nodes of the node to be predicted are 8 child nodes obtained through octree partitioning on the node to be predicted.

It should be noted that in the embodiment of the present application, since there are 26 neighboring nodes around the node to be predicted and the node to be predicted includes 8 child nodes, the decoder may detect and obtain 26 pieces of occupancy information and 26 decoding states corresponding to the 26 neighboring nodes, and at the same time, for each of the 8 child nodes, there is a corresponding distance parameter characterizing a distance from the 26 neighboring nodes.

Further, in the embodiment of the present application, the occupancy information of the neighboring node may be used for characterizing whether the neighboring node is occupied, specifically, the occupancy information may indicate occupancy or unoccupancy, that is, it may be non-empty or empty. Herein, occupancy (non-empty) may be expressed as 1, and unoccupancy (empty) may be expressed as 0.

It should be noted that in the embodiment of the present application, the decoding state is used for determining whether the neighboring node has been decoded, so the decoding state may indicate that it has been decoded or not decoded. Further, in the present application, for a neighboring node whose decoding state indicate that it has been decoded, the neighboring node has 8 child nodes, so the decoding state may also be used for determining whether the neighboring node has a child node.

Further, in the embodiment of the present application, for a decoded neighboring node, that is, a decoded neighboring node in neighboring nodes, the decoder may further determine occupancy information corresponding to 8 child nodes of the neighboring node, so as to determine how many occupied child nodes are present in the 8 child nodes of the neighboring node, that is, determine a quantity of occupied child nodes corresponding to the decoded neighboring node in the neighboring nodes.

It should be noted that in the embodiment of the present application, when determining the occupancy information corresponding to the neighboring node of the node to be predicted and the distance parameter between the child node of the node to be predicted and the neighboring node, the decoder may specifically determine the occupancy information and the distance parameter according to a layer level parameter of the node to be predicted, a pre-stored Morton 3D map, and coordinates of an origin of the node to be predicted. That is to say, the decoder may input the layer level parameter of the node to be predicted, the pre-stored Morton 3D map, and the coordinates of the origin of the node to be predicted in a point cloud respectively, so that the occupancy information corresponding to the neighboring node and the distance parameter between the child node of the node to be predicted and the neighboring node may be determined.

It may be understood that in the embodiment of the present application, the pre-stored Morton 3D map may be used for mapping (x, y, z) coordinates and flag bits. Specifically, the decoder may determine the pre-stored Morton 3D map by using Morton codes based on the (x, y, z) coordinates of the point cloud.

In act 502, a preset weight set is acquired according to the distance parameter and the quantity of occupied child nodes.

In the embodiment of the present application, after determining the distance parameter between the child node of the node to be predicted and the neighboring node, the decoder may acquire the preset weight set according to the distance parameter and the quantity of occupied child nodes.

It should be noted that in the embodiment of the present application, the preset weight set may include a first weight, a second weight, and a third weight. Specifically, the preset weight set corresponds to the distance parameter and the quantity of occupied child nodes, in which both the first weight and the second weight correspond to the distance parameter and the third weight corresponds to the quantity of occupied child nodes.

Further, in the embodiment of the present application, the first weight, the second weight, and the third weight may be used for predicting the occupancy information of the child node of the node to be predicted under different conditions and circumstances. Herein, the first weight, the second weight, and the third weight are all obtained through learning and training, and they are preset fixed values in the decoder, and do not need to be transmitted from an encoder to a decoder.

It should be noted that in the embodiment of the present application, although both the first weight and the second weight correspond to the distance parameter, the first weight and the second weight obtained through learning and training have different values.

It may be understood that in the embodiment of the present application, for 8 child nodes of the node to be predicted, each child node corresponds to 26 neighboring nodes and has 26 distance parameters, so each child node has 26 preset weight sets.

In act 503, an occupancy weight corresponding to the child node is determined based on the preset weight set, the decoding state, and the occupancy information.

In the embodiment of the present application, after determining the occupancy information and the decoding state corresponding to the neighboring node and simultaneously acquiring the preset weight set corresponding to the distance parameter and the quantity of occupied child nodes, the decoder may further determine the occupancy weight corresponding to the child node of the node to be predicted according to the preset weight set, the decoding state, and the occupancy information.

It should be noted that in the embodiment of the present application, after determining the decoding state and the occupancy information corresponding to the neighboring node, the decoder may select a calculation method of the occupancy weight of the child node based on the decoding state and the occupancy information. Specifically, whether the neighboring node is occupied or not and whether the neighboring node has been decoded will all have an impact on the calculation method of the occupancy weight of the child node.

Further, in the embodiment of the present application, if the occupancy information of the neighboring node indicates unoccupancy, then the occupancy weight of the child node may be directly determined by using the first weight in the preset weight set.

Further, in the embodiment of the present application, if the occupancy information of the neighboring node indicates occupancy and the decoding state of the neighboring node indicates decoded, then the occupancy weight of the child node may be directly determined by using the second weight and the third weight in the preset weight set.

Further, in the embodiment of the present application, if the occupancy information of the neighboring node indicates occupancy and the decoding state of the neighboring node indicates undecoded, then the occupancy weight of the child node may be directly determined by using the second weight in the preset weight set.

It should be noted that in the embodiment of the present application, each of 8 child nodes of the node to be predicted corresponds to 26 neighboring nodes and has 26 distance parameters, and each child node corresponds to 26 preset weight sets. Therefore, for each child node, the decoder may calculate and obtain 26 weight parameters corresponding to 26 neighboring nodes by using the 26 preset weight sets, so that the occupancy weight of the child node may be calculated based on the 26 weight parameters.

It may be understood that in the embodiment of the present application, the decoder may use a following formula (8) to calculate a weight parameter $W(d_{k,m}, \delta_k, n_k)$ of an m-th child node m based on a decoding state and occupancy information $\delta_k$ corresponding to a k-th neighboring node k of the node to be predicted.

$$W(d_{k,m}, \delta_k, n_k) = \begin{cases} W0(d_{k,m}) & \text{if } \delta_k = 0 \\ W1(d_{k,m}) \times W(n_k) & \text{if } \delta_k = 1, \text{ decoded} \\ W1(d_{k,m}) & \text{if } \delta_k = 1, \text{ not decoded} \end{cases} \quad (8)$$

A value of k is 1, 2, . . . , and 26, and a value of m is 1, 2, . . . , and 8, and $d_{k,m}$ is a distance parameter between the neighboring node k and the child node m of the node to be predicted. If the decoding state of the neighboring node k indicates that it has been decoded, a quantity of occupied child nodes of the decoded neighboring node k in 8 child nodes of the neighboring node k is $n_k$. $W0(d_{k,m})$ is the first weight, $W1(d_{k,m})$ is the second weight, and $W(n_k)$ is the third weight. It may be seen that both the first weight $W0(d_{k,m})$ and the second weight $W1(d_{k,m})$ are related to $d_{k,m}$, and the third weight $W(n_k)$ is related to $n_k$.

Further, in the embodiment of the present application, after calculating and obtaining all 26 weight parameters $W(d_{k,m}, \delta_k, n_k)$ of a child node, the decoder may calculate an average value of all 26 weight parameters by using the above formula (4), so as to obtain an occupancy weight score corresponding to the child node.

It may be understood that in the embodiment of the present application, according to whether the neighboring node has been decoded and occupied, the decoder may calculate and obtain the occupancy weight of the child node of the node to be predicted according to different calculation methods based on the preset weight set. When the neighboring node is occupied and decoded, the decoder may further determine the occupancy weight of the child node of the node to be predicted by using the quantity of occupied child nodes of the decoded neighboring node.

In the embodiment of the present application, further, when determining the occupancy weight according to the second weight and the third weight, the decoder may first correct the third weight by using a preset correlation coefficient to obtain a corrected weight; and then determine the occupancy weight according to the second weight and the corrected weight.

Specifically, in the embodiment of the present application, for the third weight corresponding to the quantity of occupied child nodes, the decoder may add a preset correlation coefficient related to a quantization parameter for correction, so as to bring more significant gains to a codec under different quantization degrees. Based on the above formula (8), the decoder may use the formula (5) to correct the third weight $W(n_k)$ to obtain the corrected weight $\tilde{W}(n_k)$.

It should be noted that in the embodiment of the present application, the preset correlation coefficient needs to be signalled in a binary bitstream output by the encoder as an input of the decoder, so that a same correction is made to the third weight at a decoder.

In act 504, a prediction processing is performed on the child node according to the occupancy weight and a preset occupancy threshold set to obtain a node type corresponding to the child node.

In the embodiment of the present application, after determining the occupancy weight corresponding to the child node based on the preset weight set, the decoding state, and the occupancy information, the decoder may perform the prediction processing on the child node according to the occupancy weight and the preset occupancy threshold set, so as to obtain the node type corresponding to the child node.

Further, in the embodiment of the present application, the decoder may first obtain the preset occupancy threshold set, wherein the preset occupancy threshold set includes a first threshold and a second threshold, specifically the first threshold is smaller than the second threshold.

It should be noted that in the embodiment of the present application, both the first threshold and the second threshold correspond to the quantity of occupied neighboring nodes in the neighboring nodes. Therefore, before performing the prediction processing on the child node according to the occupancy weight and the preset occupancy threshold set to obtain the node type corresponding to the child node, the decoder may first determine a quantity of nodes whose occupancy information indicates occupancy in the neighboring nodes, that is, determine a quantity of occupied neighboring nodes in the neighboring nodes.

Further, in the embodiment of the present application, after determining the quantity of occupied neighboring nodes in neighboring nodes, the decoder may determine the first threshold and the second threshold corresponding to the quantity of occupied neighboring nodes from the preset occupancy threshold set.

It should be noted that in the embodiment of the present application, the node type of the child node of the node to be predicted may include three types: occupancy, unoccupancy, and unprediction, in which, occupancy characterizes that a prediction result of the occupancy information of the child node indicates occupancy; unoccupancy characterizes that a prediction result of the occupancy information of the child node indicates unoccupancy; and unprediction characterizes that prediction of occupancy information on the child node is not performed.

It should be noted that in the embodiment of the present application, when performing the prediction processing on the child node according to the occupancy weight and the preset occupancy threshold set, the decoder may compare the occupancy weight with the first threshold and the second threshold respectively to obtain a comparison result, so as to achieve a prediction on the child node of the node to be predicted according to the comparison result to obtain the node type of the child node of the node to be predicted.

Further, in the embodiment of the present application, after comparing the occupancy weight with the first threshold and the second threshold respectively, the decoder may determine the node type as unoccupancy if a comparison result is that the occupancy weight is smaller than the first threshold.

Further, in the embodiment of the present application, after comparing the occupancy weight with the first threshold and the second threshold respectively, the decoder may determine the node type as occupancy if a comparison result is that the occupancy weight is greater than the second threshold.

Further, in the embodiment of the present application, after comparing the occupancy weight with the first threshold and the second threshold respectively, the decoder may determine the node type as unprediction if a comparison result is that the occupancy weight is greater than or equal to the first threshold and smaller than or equal to the second threshold.

It should be noted that in the embodiment of the present application, when the occupancy weight is greater than or equal to the first threshold and smaller than or equal to the second threshold, the decoder cannot perform prediction of occupancy information on the child node based on the first weight, the second weight, and the third weight, so it may determine the node type of the child node as unprediction.

Furthermore, in the embodiment of the present application, both the first threshold and the second threshold are obtained through learning and training, and they are preset fixed values in the decoder, and do not need to be transmitted from the encoder to the decoder.

In act 505, predicted occupancy information of the node to be predicted is output based on node types.

In the embodiment of the present application, after performing the prediction processing on the child node according to the occupancy weight and the preset occupancy threshold set to obtain the node type corresponding to the child node, the decoder may output the predicted occupancy information of the node to be predicted based on node types.

It should be noted that in the embodiment of the present application, the predicted occupancy information of the node to be predicted includes eight node types corresponding to all eight child nodes of the node to be predicted.

Further, in the embodiment of the present application, for any child node of the node to be predicted, the decoder may perform prediction of occupancy information on the child node according to 26 neighboring nodes around the node to be predicted by using the above-mentioned method from act 501 to act 504, so as to obtain a node type corresponding to the child node. Specifically, the decoder may first determine 26 weight parameters corresponding to the child node by using occupancy information of a neighboring node of the 26 neighboring nodes, a decoding state of the neighboring node, and a distance parameter between the neighboring node and the child node, then calculate an average value of the 26 weight parameters corresponding to the child node to obtain an occupancy weight corresponding to the child node, and then determine a node type corresponding to the child node by comparing the occupancy weight with a preset occupancy threshold set.

It should be noted that in the embodiment of the present application, the predicted occupancy information of the node to be predicted output by the decoder based on node types is the occupancy information of the node to be predicted obtained by performing prediction of occupancy information on all 8 child nodes of the node to be predicted based on the above-mentioned method of act 501 to act 504 to complete prediction on occupancy information of the node to be predicted.

It may be understood that in the embodiment of the present application, the decoder may traverse all 8 child nodes of the node to be predicted until all 8 node types corresponding to all 8 child nodes of the node to be predicted are determined, and finally output predicted occupancy information of the node to be predicted by using all the 8 node types.

It should be noted that in the embodiment of the present application, after outputting the predicted occupancy information of the node to be predicted based on node types, the decoder may perform a decoding processing of geometric information on the node to be predicted according to the predicted occupancy information.

In the embodiment of the present application, further, before determining the occupancy information corresponding to the neighboring node of the node to be predicted, the decoding state of the neighboring node, and the distance parameter between the child node of the node to be predicted and the neighboring node, the decoder may also first determine a point cloud sequence type corresponding to the node to be predicted, and then obtain a preset weight set and a preset occupancy threshold set corresponding to the point cloud sequence type.

That is to say, in the embodiment of the present application, for different point cloud sequence types, the decoder may perform prediction of occupancy information on the node to be predicted by using different preset weight sets and preset occupancy threshold sets. That is, when performing prediction of occupancy information on the node to be predicted, the first weight, the second weight, the third weight, the first threshold, and the second threshold used by the decoder are matched with a point cloud sequence types corresponding to the node to be predicted, so as to achieve higher gains when compressing point clouds of different point cloud sequence types.

Herein, according to an actual density, point cloud sequence types may be partitioned into three types: sparse, medium, and dense. And the first weight, the second weight, the third weight, the first threshold, and the second threshold are respectively trained for three different point cloud sequence types.

It should be noted that in the embodiment of the present application, the point cloud sequence type needs to be signalled in a binary bitstream output by the encoder as an input of the decoder, so that a matched preset weight set and preset occupancy threshold set may be selected at the decoder to perform same intra prediction as the encoder.

The embodiment of the present application provides a method for predicting occupancy information. When decoding geometric information based on an octree, a decoder determines occupancy information corresponding to a neighboring node of a node to be predicted, a decoding state of the neighboring node, a quantity of occupied child nodes of a decoded neighboring node in neighboring nodes, and a distance parameter between a child node of the node to be predicted and the neighboring node; acquires a preset weight set according to the distance parameter and the quantity of the occupied child nodes; determines an occupancy weight corresponding to the child node based on the preset weight set, the decoding state, and the occupancy information; performs a prediction processing on the child node according to the occupancy weight and a preset occupancy threshold set to obtain a node type corresponding to the child node; and outputs predicted occupancy information of the node to be predicted based on node types. It may be seen that in the embodiment of the present application, when using occupancy information of a neighboring node for intra prediction of occupancy information on a node to be predicted, a codec may introduce an encoding and decoding state of the neighboring node into a prediction process. Specifically, if the encoding and decoding state of the neighboring node indicates encoded or decoded, an occupancy situation of a child node corresponding to the neighboring node may be added into a process of weight calculation and threshold comparison, so that spatial correlation of neighboring nodes is fully utilized, thereby improving accuracy of intra prediction and further improving encoding efficiency.

Figure 10:
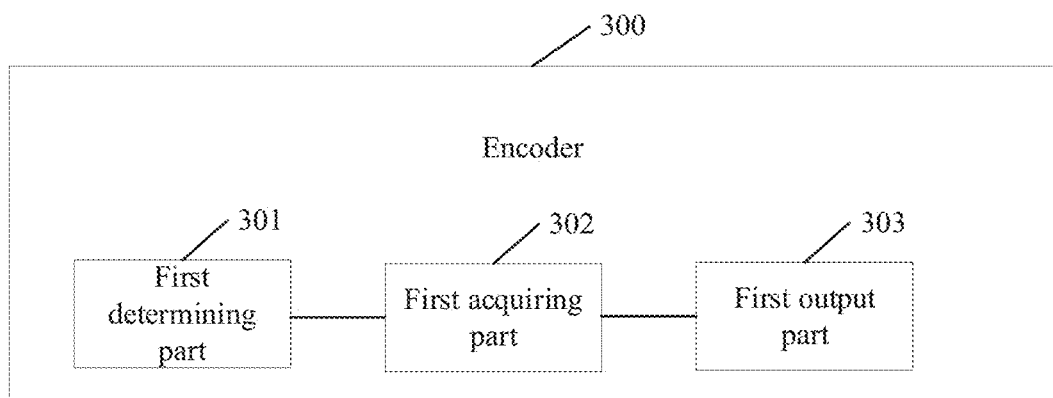
FIG. 10 is a first schematic diagram of a structure of an encoder.

Based on the above embodiments, a further embodiment of the present application provides an encoder. FIG. 10 is a first schematic diagram of a structure of an encoder. As shown in FIG. 10, an encoder 300 according to an embodiment of the present application may include a first determining part 301, a first acquiring part 302, and an output part 303.

The first determining part 301 is configured to determine occupancy information corresponding to a neighboring node of a node to be predicted, an encoding state of the neighboring node, a quantity of occupied child nodes of an encoded neighboring node in neighboring nodes, and a distance parameter between a child node of the node to be predicted and the neighboring node when encoding geometric information based on an octree.

The first acquiring part 302 is configured to acquire a preset weight set according to the distance parameter and the quantity of the occupied child nodes.

The first determining part 301 is further configured to determine an occupancy weight corresponding to the child node based on the preset weight set, the encoding state, and the occupancy information.

The first acquiring part 302 is further configured to perform a prediction processing on the child node according to the occupancy weight and a preset occupancy threshold set to obtain a node type corresponding to the child node.

The first output part 303 is configured to output predicted occupancy information of the node to be predicted based on node types.

Figure 11:
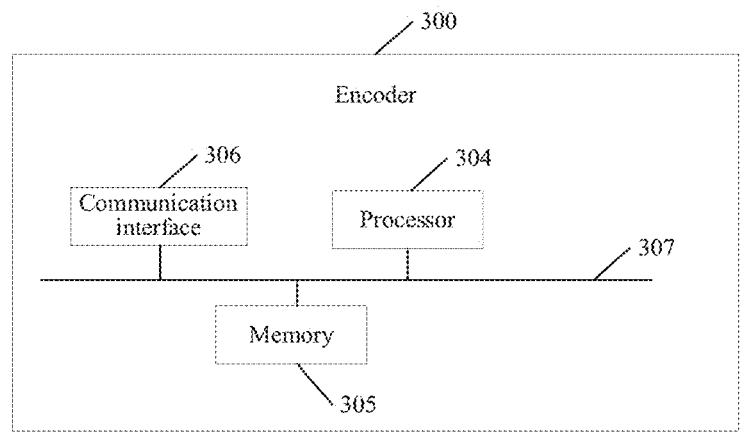
FIG. 11 is a second schematic diagram of a structure of an encoder.

FIG. 11 is a second schematic diagram of a structure of an encoder. As shown in FIG. 11, an encoder 300 according to an embodiment of the present application may further include a first processor 304, a first memory 305 storing instructions executable by the first processor 304 thereon, a first communication interface 306, and a first bus 307 configured to connect the first processor 304, the first memory 305, and the first communication interface 306.

Further, in the embodiment of the present application, the first processor 304 is configured to determine occupancy information corresponding to a neighboring node of a node to be predicted, an encoding state of the neighboring node, a quantity of occupied child nodes of an encoded neighboring node in neighboring nodes, and a distance parameter between a child node of the node to be predicted and the neighboring node when encoding geometric information based on an octree; acquire a preset weight set according to the distance parameter and the quantity of the occupied child nodes; determine an occupancy weight corresponding to the child node based on the preset weight set, the encoding state, and the occupancy information; perform a prediction processing on the child node according to the occupancy weight and a preset occupancy threshold set to obtain a node type corresponding to the child node; and output predicted occupancy information of the node to be predicted based on node types.

In addition, various functional modules in the embodiments may be integrated into one processing unit, or various units may be physically presented separately, or two or more than two units may be integrated into one unit. The above integrated unit may be implemented in a form of hardware, or may be implemented in a form of a software functional module.

The integrated unit, if implemented in a form of a software functional module and not sold or used as an independent product, may be stored in a computer-readable storage medium. Based on such understanding, the technical solutions of the embodiments, in essence, or part contributing to the prior art, or all or part of the technical solutions, may be embodied in a form of a software product. The computer software product is stored in a storage medium, and includes several instructions for enabling a computer device (which may be a personal computer, a server, or a network device, etc.) or a processor to perform all or part of acts of the methods of the embodiments. The aforementioned storage medium includes various media, such as a U disk, a mobile hard disk, a Read Only Memory (ROM), a Random Access Memory (RAM), a magnetic disk, or an optical disk, which are capable of storing program codes.

The embodiment of the present application provides an encoder. When encoding geometric information based on an octree, the encoder determines occupancy information corresponding to a neighboring node of a node to be predicted, an encoding state of the neighboring node, a quantity of occupied child nodes of an encoded neighboring node in neighboring nodes, and a distance parameter between a child node of the node to be predicted and the neighboring node; acquires a preset weight set according to the distance parameter and the quantity of the occupied child nodes; determines an occupancy weight corresponding to the child node based on the preset weight set, the encoding state, and the occupancy information; performs a prediction processing on the child node according to the occupancy weight and a preset occupancy threshold set to obtain a node type corresponding to the child node; and outputs predicted occupancy information of the node to be predicted based on node types. It may be seen that in the embodiment of the present application, when using occupancy information of a neighboring node for intra prediction of occupancy information on a node to be predicted, a codec may introduce an encoding and decoding state of the neighboring node into a prediction process. Specifically, if the encoding and decoding state of the neighboring node indicates encoded or decoded, an occupancy situation of a child node corresponding to the neighboring node may be added into a process of weight calculation and threshold comparison, so that spatial correlation of neighboring nodes is fully utilized, thereby improving accuracy of intra prediction and further improving encoding efficiency.

Figure 12:
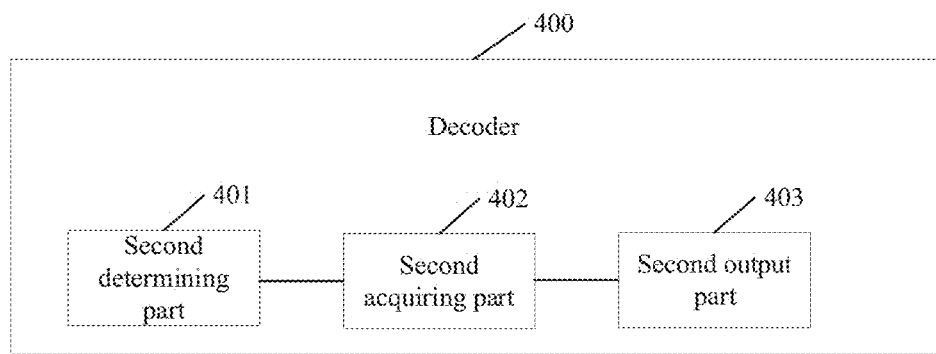
FIG. 12 is a first schematic diagram of a structure of a decoder.

Based on the above embodiments, in another embodiment of the present application, FIG. 12 is a first schematic diagram of a structure of a decoder. As shown in FIG. 12, a decoder 400 according to an embodiment of the present application may include a second determining part 404, a second acquiring part 402, and a second output part 403.

The second determining part 401 is configured to determine occupancy information corresponding to a neighboring node of a node to be predicted, a decoding state of the neighboring node, a quantity of occupied child nodes of a decoded neighboring node in neighboring nodes, and a distance parameter between a child node of the node to be predicted and the neighboring node when decoding geometric information based on an octree.

The second acquiring part 402 is configured to acquire a preset weight set according to the distance parameter and the quantity of the occupied child nodes.

The second determining part 401 is further configured to determine an occupancy weight corresponding to the child node based on the preset weight set, the decoding state, and the occupancy information.

The second acquiring part 402 is further configured to perform a prediction processing on the child node according to the occupancy weight and a preset occupancy threshold set to obtain a node type corresponding to the child node.

The second output part 403 is configured to output predicted occupancy information of the node to be predicted based on node types.

Figure 13:
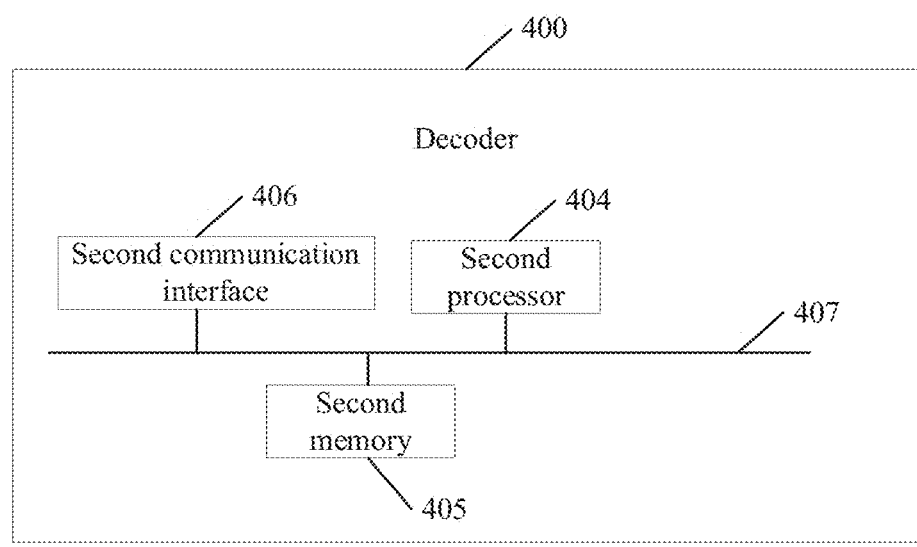
FIG. 13 is a second schematic diagram of a structure of a decoder.

FIG. 13 is a second schematic diagram of a structure of a decoder. As shown in FIG. 13, a decoder 400 according to an embodiment of the present application may further include a second processor 404, a second memory 405 storing instructions executable by the second processor 404 thereon, a second communication interface 406, and a second bus 407 configured to connect the second processor 404, the second memory 405, and the second communication interface 406.

Further, in the embodiment of the present application, the second processor 404 is configured to determine occupancy information corresponding to a neighboring node of a node to be predicted, a decoding state of the neighboring node, a quantity of occupied child nodes of a decoded neighboring node in neighboring nodes, and a distance parameter between a child node of the node to be predicted and the neighboring node when decoding geometric information based on an octree; acquire a preset weight set according to the distance parameter and the quantity of the occupied child nodes; determine an occupancy weight corresponding to the child node based on the preset weight set, the decoding state, and the occupancy information; perform a prediction processing on the child node according to the occupancy weight and a preset occupancy threshold set to obtain a node type corresponding to the child node; and output predicted occupancy information of the node to be predicted based on node types.

In addition, various functional modules in the embodiments may be integrated into one processing unit, or various units may be physically presented separately, or two or more than two units may be integrated into one unit. The above integrated unit may be implemented in a form of hardware, or may be implemented in a form of a software functional module.

The integrated unit, if implemented in a form of a software functional module and not sold or used as an independent product, may be stored in a computer-readable storage medium. Based on such understanding, the technical solutions of the embodiments, in essence, or part contributing to the prior art, or all or part of the technical solutions, may be embodied in a form of a software product. The computer software product is stored in a storage medium, and includes several instructions for enabling a computer device (which may be a personal computer, a server, or a network device, etc.) or a processor to perform all or part of acts of the methods of the embodiments. The aforementioned storage medium includes various media, such as a U disk, a mobile hard disk, a Read Only Memory (ROM), a Random Access Memory (RAM), a magnetic disk, or an optical disk, which are capable of storing program codes.

The embodiment of the present application provides a decoder. When decoding geometric information based on an octree, the decoder determines occupancy information corresponding to a neighboring node of a node to be predicted, a decoding state of the neighboring node, a quantity of occupied child nodes of a decoded neighboring node in neighboring nodes, and a distance parameter between a child node of the node to be predicted and the neighboring node; acquires a preset weight set according to the distance parameter and the quantity of the occupied child nodes; determines an occupancy weight corresponding to the child node based on the preset weight set, the decoding state, and the occupancy information; performs a prediction processing on the child node according to the occupancy weight and a preset occupancy threshold set to obtain a node type corresponding to the child node; and outputs predicted occupancy information of the node to be predicted based on node types. It may be seen that in the embodiment of the present application, when using occupancy information of a neighboring node for intra prediction of occupancy information on a node to be predicted, a codec may introduce an encoding and decoding state of the neighboring node into a prediction process. Specifically, if the encoding and decoding state of the neighboring node indicates encoded or decoded, an occupancy situation of a child node corresponding to the neighboring node may be added into a process of weight calculation and threshold comparison, so that spatial correlation of neighboring nodes is fully utilized, thereby improving accuracy of intra prediction and further improving encoding efficiency.

An embodiment of the present application provides a computer-readable storage medium on which a program is stored, when the program is executed by a processor, the method described in the foregoing embodiment is implemented.

Specifically, program instructions corresponding to a method for predicting occupancy information in the present embodiment may be stored on a storage medium, such as an optical disk, a hard disk, and a U disk. When program instructions corresponding to a method for predicting occupancy information in a storage medium are read or executed by an electronic device, following acts are included.

Occupancy information corresponding to a neighboring node of a node to be predicted, an encoding state of the neighboring node, a quantity of occupied child nodes of an encoded neighboring node in neighboring nodes, and a distance parameter between a child node of the node to be predicted and the neighboring node is determined when encoding geometric information based on an octree.

A preset weight set is acquired according to the distance parameter and the quantity of the occupied child nodes.

An occupancy weight corresponding to the child node is determined based on preset weight sets, encoding states, and occupancy information.

A prediction processing is performed on the child node according to the occupancy weight and a preset occupancy threshold set to obtain a node type corresponding to the child node.

Predicted occupancy information of the node to be predicted is output based on node types.

When program instructions corresponding to a method for predicting occupancy information in a storage medium are read or executed by an electronic device, following acts are further included.

Occupancy information corresponding to a neighboring node of a node to be predicted, an encoding state of the neighboring node, a quantity of occupied child nodes of an encoded neighboring node in neighboring nodes, and a distance parameter between a child node of the node to be predicted and the neighboring node is determined when encoding geometric information based on an octree.

A preset weight set is acquired according to the distance parameter and the quantity of the occupied child nodes.

An occupancy weight corresponding to the child node is determined based on preset weight sets, encoding states, and occupancy information.

A prediction processing is performed on the child node according to the occupancy weight and a preset occupancy threshold set to obtain a node type corresponding to the child node.

Predicted occupancy information of the node to be predicted is output based on node types.

It should be understood by a person skilled in the art that the embodiments of the present application may be provided as methods, systems, or computer program products. Therefore, the present application may use a form of a hardware embodiment, a software embodiment, or an embodiment combining software and hardware. Moreover, the present application may use a form of a computer program product implemented on one or more computer usable storage media (including, but not limited to, a magnetic disk memory, an optical memory, etc.) containing computer usable program codes.

The present application is described with reference to implementation flowcharts and/or block diagrams of the methods, devices (systems), and computer program products of the embodiments of the present application. It should be understood that each flow and/or block in the flowcharts and/or the block diagrams, and combinations of flows and/or blocks in the flowcharts and/or the block diagrams may be implemented by computer program instructions. These computer program instructions may be provided to a processor of a general purpose computer, a special purpose computer, an embedded processing machine, or another programmable data processing device to generate a machine, such that an apparatus for implementing functions specified in one or more flows in the implementation flowcharts and/or one or more blocks in the block diagrams is generated through instructions that are executed by a processor of a computer or another programmable data processing device.

These computer program instructions may also be stored in a computer-readable memory that may guide a computer or another programmable data processing device to operate in a particular manner, such that instructions stored in the computer-readable memory generate an article of manufacture including an instruction apparatus, wherein the instruction apparatus implements functions specified in one or more flows in the implementation flowcharts and/or one or more blocks in the block diagrams.

These computer program instructions may also be loaded on a computer or another programmable data processing device to enable a series of operational acts to be performed on the computer or the another programmable device to generate a computer-implemented processing, such that instructions executed on the computer or the another programmable device provide acts for implementing functions specified in one or more flows in the implementation flowcharts and/or one or more blocks in the block diagrams.

The above are only preferred embodiments of the present application and are not intended to limit the scope of protection of the present application.

INDUSTRIAL APPLICABILITY

Embodiments of the present application provide a method for predicting occupancy information, an encoder, a decoder, and a storage medium. When encoding geometric information based on an octree, the encoder determines occupancy information corresponding to a neighboring node of a node to be predicted, an encoding state of the neighboring node, a quantity of occupied child nodes of an encoded neighboring node in neighboring nodes, and a distance parameter between a child node of the node to be predicted and the neighboring node; acquires a preset weight set according to the distance parameter and the quantity of the occupied child nodes; determines an occupancy weight corresponding to the child node based on the preset weight set, the encoding state, and the occupancy information; performs a prediction processing on the child node according to the occupancy weight and a preset occupancy threshold set to obtain a node type corresponding to the child node; and outputs predicted occupancy information of the node to be predicted based on node types. When decoding geometric information based on an octree, the decoder determines occupancy information corresponding to a neighboring node of a node to be predicted, a decoding state of the neighboring node, a quantity of occupied child nodes of a decoded neighboring node in neighboring nodes, and a distance parameter between a child node of the node to be predicted and the neighboring node; acquires a preset weight set according to the distance parameter and the quantity of the occupied child nodes; determines an occupancy weight corresponding to the child node based on the preset weight set, the decoding state, and the occupancy information; performs a prediction processing on the child node according to the occupancy weight and a preset occupancy threshold set to obtain a node type corresponding to the child node; and outputs predicted occupancy information of the node to be predicted based on node types. It may be seen that in the embodiment of the present application, when using occupancy information of a neighboring node for intra prediction of occupancy information on a node to be predicted, a codec may introduce an encoding and decoding state of the neighboring node into a prediction process. Specifically, if the encoding and decoding state of the neighboring node indicates encoded or decoded, an occupancy situation of a child node corresponding to the neighboring node may be added into a process of weight calculation and threshold comparison, so that spatial correlation of neighboring nodes is fully utilized, thereby improving accuracy of intra prediction and further improving encoding efficiency.

The invention claimed is:

1. A method for predicting occupancy information, applied to an encoder, wherein the method comprises:
    determining encoding information corresponding to a neighboring node of a node to be predicted, and a distance parameter between a child node of the node to be predicted and the neighboring node when encoding geometric information based on an octree; wherein the encoding information corresponding to the neighboring node comprises occupancy information;
    determining an occupancy weight corresponding to the child node of the node to be predicted based on the distance parameter, and the encoding information corresponding to the neighboring node;
    performing a prediction processing on the child node of the node to be predicted according to the occupancy weight and a preset occupancy threshold set to obtain a node type corresponding to the child node of the node to be predicted.

2. The method according to claim 1, wherein
    the encoding information corresponding to the neighboring node further comprises an encoding state of the neighboring node, and encoding information of a child node of an encoded neighboring node in neighboring nodes;
    determining the occupancy weight corresponding to the child node of the node to be predicted based on the distance parameter, and the encoding information corresponding to the neighboring node comprises:
    determining the occupancy weight corresponding to the child node of the node to be predicted based on the distance parameter, the occupancy information corresponding to the neighboring node, the encoding state of the neighboring node, and the encoding information of the child node of the encoded neighboring node in the neighboring nodes.

3. The method according to claim 2, wherein the encoding information of the child node of the encoded neighboring node in the neighboring nodes comprises occupancy information of the child node of the encoded neighboring node, determining a quantity of occupied child nodes of the encoded neighboring node according to the occupancy information of the child node of the encoded neighboring node;
    determining the occupancy weight corresponding to the child node of the node to be predicted based on the distance parameter, the occupancy information corresponding to the neighboring node, the encoding state of the neighboring node, and the encoding information of the child node of the encoded neighboring node in the neighboring nodes comprises:
    acquiring a preset weight set according to the distance parameter and the quantity of the occupied child nodes; and
    determining the occupancy weight corresponding to the child node of the node to be predicted based on the preset weight set, the encoding state of the neighboring node, and the occupancy information corresponding to the neighboring node.

4. The method according to claim 3, wherein the preset weight set comprises a first weight, a second weight, and a third weight; wherein the first weight and the second weight correspond to the distance parameter; the first weight and the second weight have different values; and the third weight corresponds to the quantity of the occupied child nodes;
    wherein the determining the occupancy weight corresponding to the child node of the node to be predicted based on the preset weight set, the encoding state of the neighboring node, and the occupancy information corresponding to the neighboring node comprises:
    determining the occupancy weight corresponding to the child node of the node to be predicted according to the first weight if the occupancy information corresponding to the neighboring node indicates unoccupancy;
    determining the occupancy weight corresponding to the child node of the node to be predicted according to the second weight and the third weight if the occupancy information corresponding to the neighboring node indicates occupancy and the encoding state of the neighboring node indicates encoded;
    determining the occupancy weight corresponding to the child node of the node to be predicted according to the second weight if the occupancy information corresponding to the neighboring node indicates occupancy and the encoding state of the neighboring node indicates uncoded.

5. The method according to claim 1, wherein the performing the prediction processing on the child node of the node to be predicted according to the occupancy weight and the preset occupancy threshold set to obtain the node type corresponding to the child node of the node to be predicted comprises:
  determining a first threshold and a second threshold from the preset occupancy threshold set; wherein the first threshold is smaller than the second threshold; and
  obtaining the node type corresponding to the child node of the node to be predicted according to the occupancy weight corresponding to the child node of the node to be predicted, the first threshold, and the second threshold;
  determining that the node type corresponding to the child node of the node to be predicted is unoccupancy if the occupancy weight corresponding to the child node of the node to be predicted is smaller than or equal to the first threshold;
  determining that the node type corresponding to the child node of the node to be predicted is occupancy if the occupancy weight corresponding to the child node of the node to be predicted is greater than or equal to the second threshold; and
  determining that the node type corresponding to the child node of the node to be predicted is unprediction if the occupancy weight corresponding to the child node of the node to be predicted is greater than the first threshold and smaller than the second threshold.

6. The method according to claim 1, before the determining the encoding information corresponding to the neighboring node of the node to be predicted, and the distance parameter between the child node of the node to be predicted and the neighboring node when encoding the geometric information based on the octree, the method further comprises:
  determining a current layer level; wherein the current layer level represents a quantity of layers obtained through octree partitioning; and
  enabling an intra prediction function when the current layer level is greater than or equal to a preset layer quantity threshold.

7. The method according to claim 1, wherein the determining the encoding information corresponding to the neighboring node of the node to be predicted, and the distance parameter between the child node of the node to be predicted and the neighboring node comprises:
  determining the occupancy information of the neighboring node and the distance parameter according to a layer level parameter of the node to be predicted, a pre-stored Morton three-dimensional map, and coordinates of an origin of the node to be predicted.

8. An encoder comprising a first processor and a first memory storing instructions executable by the first processor, wherein when the instructions are executed by the first processor, the method according to claim 1 is implemented.

9. A computer-readable non-transient storage medium on which a program is stored, applied to an encoder, wherein when the program is executed by a processor, the method according to claim 1 is implemented.

10. A method for predicting occupancy information, applied to a decoder, wherein the method comprises:
  determining decoding information corresponding to a neighboring node of a node to be predicted, and a distance parameter between a child node of the node to be predicted and the neighboring node when decoding geometric information based on an octree; wherein the decoding information corresponding to the neighboring node comprises occupancy information;
  determining an occupancy weight corresponding to the child node of the node to be predicted based on the distance parameter, and the decoding information corresponding to the neighboring node;
  performing a prediction processing on the child node of the node to be predicted according to the occupancy weight and a preset occupancy threshold set to obtain a node type corresponding to the child node of the node to be predicted.

11. The method according to claim 10, wherein
  the decoding information corresponding to the neighboring node further comprises a decoding state of the neighboring node, and decoding information of a child node of a decoded neighboring node in neighboring nodes;
  determining the occupancy weight corresponding to the child node of the node to be predicted based on the distance parameter, and the decoding information corresponding to the neighboring node comprises:
  determining the occupancy weight corresponding to the child node of the node to be predicted based on the distance parameter, the occupancy information corresponding to the neighboring node, the decoding state of the neighboring node, and the decoding information of the child node of the decoded neighboring node in the neighboring nodes.

12. The method according to claim 11, wherein the decoding information of the child node of the decoded neighboring node in the neighboring nodes comprises occupancy information of the child node of the decoded neighboring node, determining a quantity of occupied child nodes of the decoded neighboring node according to the occupancy information of the child node of the decoded neighboring node;
  determining the occupancy weight corresponding to the child node of the node to be predicted based on the distance parameter, the occupancy information corresponding to the neighboring node, the decoding state of the neighboring node, and the decoding information of the child node of the decoded neighboring node in the neighboring nodes comprises:
  acquiring a preset weight set according to the distance parameter and the quantity of the occupied child nodes; and
  determining the occupancy weight corresponding to the child node of the node to be predicted based on the preset weight set, the decoding state of the neighboring node, and the occupancy information corresponding to the neighboring node.

13. The method according to claim 12, wherein the preset weight set comprises a first weight, a second weight, and a third weight; wherein the first weight and the second weight correspond to the distance parameter; the first weight and the second weight have different values; and the third weight corresponds to the quantity of the occupied child nodes;
  wherein the determining the occupancy weight corresponding to the child node of the node to be predicted based on the preset weight set, the decoding state of the neighboring node, and the occupancy information corresponding to the neighboring node comprises:
  determining the occupancy weight corresponding to the child node of the node to be predicted according to the first weight if the occupancy information corresponding to the neighboring node indicates unoccupancy;
  determining the occupancy weight corresponding to the child node of the node to be predicted according to the second weight and the third weight if the occupancy information corresponding to the neighboring node indicates occupancy and the decoding state of the neighboring node indicates decoded;

determining the occupancy weight corresponding to the child node of the node to be predicted according to the second weight if the occupancy information corresponding to the neighboring node indicates occupancy and the decoding state of the neighboring node indicates undecoded.

14. The method according to claim 10, wherein the performing the prediction processing on the child node of the node to be predicted according to the occupancy weight and the preset occupancy threshold set to obtain the node type corresponding to the child node of the node to be predicted comprises:

determining a first threshold and a second threshold from the preset occupancy threshold set; wherein the first threshold is smaller than the second threshold; and obtaining the node type corresponding to the child node of the node to be predicted according to the occupancy weight corresponding to the child node of the node to be predicted, the first threshold, and the second threshold;

determining that the node type corresponding to the child node of the node to be predicted is unoccupancy if the occupancy weight corresponding to the child node of the node to be predicted is smaller than or equal to the first threshold;

determining that the node type corresponding to the child node of the node to be predicted is occupancy if the occupancy weight corresponding to the child node of the node to be predicted is greater than or equal to the second threshold; and determining that the node type corresponding to the child node of the node to be predicted is unprediction if the occupancy weight corresponding to the child node of the node to be predicted is greater than the first threshold and smaller than the second threshold.

15. The method according to claim 10, wherein before the determining the decoding information corresponding to the neighboring node of the node to be predicted, and the distance parameter between the child node of the node to be predicted and the neighboring node when decoding the geometric information based on the octree, the method further comprises:

determining a current layer level; wherein the current layer level represents a quantity of layers obtained through octree partitioning; and enabling an intra prediction function when the current layer level is greater than or equal to a preset layer quantity threshold.

16. The method according to claim 10, wherein the determining the decoding information corresponding to the neighboring node of the node to be predicted, and the distance parameter between the child node of the node to be predicted and the neighboring node comprises:

determining the occupancy information of the neighboring node and the distance parameter according to a layer level parameter of the node to be predicted, a pre-stored Morton three-dimensional map, and coordinates of an origin of the node to be predicted.

17. A decoder comprising a second processor and a second memory storing instructions executable by the second processor, wherein when the instructions are executed by the second processor, the method according to claim 10 is implemented.

18. A computer-readable non-transient storage medium on which a program is stored, applied to a decoder, wherein when the program is executed by a processor, the method according to claim 10 is implemented.

* * * * *